United States Patent [19]
Hobbs et al.

[11] Patent Number: 5,877,938
[45] Date of Patent: Mar. 2, 1999

[54] PACKAGING ARCHITECTURE FOR A DATA SERVER

[75] Inventors: Forrest B. Hobbs, Eau Claire; Richard G. Blewitt, Altoona; Scott A. Wentzka, Cadot; Steven S. Chen, Eau Claire; Kitrick B. Sheets, Chippewa Falls; Sheldon D. Stevens, Eau Claire, all of Wis.

[73] Assignee: Sequent Computer Systems, Inc., Beaverton, Oreg.

[21] Appl. No.: 962,747

[22] Filed: Nov. 3, 1997

Related U.S. Application Data

[62] Division of Ser. No. 518,003, Aug. 22, 1995, Pat. No. 5,684,671.

[51] Int. Cl.⁶ ............................... G06F 1/16; H05K 5/03
[52] U.S. Cl. ........................ 361/724; 361/726; 312/223.2
[58] Field of Search ..................... 361/683, 679, 361/684–686, 724–727; 364/708.1; 312/223.1, 223.2, 223.3; G06F 1/16

[56] References Cited

U.S. PATENT DOCUMENTS

| | | | |
|---|---|---|---|
| 3,001,102 | 9/1961 | Stiefel et al. | 361/724 |
| 4,680,425 | 7/1987 | Speraw | 174/50 |
| 4,728,160 | 3/1988 | Mondor et al. . | |
| 4,748,540 | 5/1988 | Henneberg et al. | 361/687 |
| 5,027,257 | 6/1991 | Lockwood et al. | 361/827 |
| 5,227,957 | 7/1993 | Deters . | |
| 5,253,141 | 10/1993 | Hellwig et al. | 361/683 |
| 5,379,184 | 1/1995 | Barraza et al. | 361/685 |
| 5,417,012 | 5/1995 | Brightman et al. . | |
| 5,457,602 | 10/1995 | Kimura et al. | 361/683 |
| 5,460,441 | 10/1995 | Hastings et al. . | |
| 5,544,008 | 8/1996 | Dimmick et al. . | |

OTHER PUBLICATIONS

Hewlett Packard Fast/Wide SCSI Disk Arrays for HP 9000 Series 800 Business Servers and Series 700 Workstations brochure, 1993.
Hewlett Packard HP Models 120T and 200T Optical Disk Jukebox brochure, Nov., 1993.
Clariion Series 200, Models 2200, 2210, & 2300 Disk Arrays brochure, 1994.
Clariion Series 1000, Models 1100, 1110, and 1300 Disk Arrays brochure, 1994.
IPL Systems ESP–RAID Tower brochure, Jun. 1994.
MTI StorageWare RAID brochure.
Siemens–Nixdorf RM600 brochure, 1994.
MTI NFS File Server StingRay NFS brochure.
Tandem Fault–Tolerant UNIX Systems Product Description for Integrity FT Systems Family, 1994.
Tandem UNIX Network Resource Server Specifications for Integrity NR SMP Servers, 1994.
Acer's AcerAltos 17000 brochure, 1994.
UNIX Review Outstanding Networking Product of 1993 FAServer ad., Dec., 1993.

(List continued on next page.)

*Primary Examiner*—Lynn D. Field
*Attorney, Agent, or Firm*—Patterson & Keough, P.A.

[57] ABSTRACT

A rack-mount data server includes a housing, a plurality of data server components supported by the housing, the components including at least one peripheral storage device, a logic chassis for the data server, at least one disk drive on which the data server stores files, and at least one power supply, and a plurality of racks coupled with the housing to accommodate the data server components, the racks including a first topmost rack accommodating the at least one peripheral storage device and a second rack accommodating the logic chassis, the housing supporting the second rack underneath the first rack as the second topmost rack. The data server also includes a front door and a top door, the top door and the front door being interlockable with each other such that when the top door and the front door are in their closed positions, one of the top door and the front door locks the other of the top door and the front door in its closed position. A security system monitors the closed and/or locked status of a number of components, including the front door.

19 Claims, 20 Drawing Sheets

OTHER PUBLICATIONS

IBM RISC System/6000 Model J30 PowerPC Server brochure, Oct., 1994.

IBM Risc System/6000 Rack Mounted Servers brochure, Oct., 1994.

IBM Scalable POWERparallel Systems Business Solutions brochure, Mar. 1994.

IBM POWERparallel Systems 9076 SP2 Model 3A2 and 9076 Sp2 Model 3A3 pamphlet.

Sequent Symmetry 5000 Clusters brochure, 1994.

Sequent WinServer 3500 brochure, 1994.

Sequent Symmetry 5000 Series brochure, 1994.

Auspek NS 7000 /Netserver Family brochure, 1994.

Hewlett Packard "Just What You'd Expect From the Leaders in UNIX Systems. Leadership!" Advertisement, Reseller Management, Sep., 1994, p. 205.

PC Wholesale advertisement.

Acer "Adapt Ability" advertisement, 1994.

Datago Hewlett Packard "Straight Talk, Honest Answers, No Hidden Costs" Advertisement, 1994.

Tatung Science & Technology SuperCOMPserver 20 Series brochure.

Sun's SPARCcluster PDB, SPARCcluster 2000PDB and SPARCserver 1000PDB brochure, Sep., 1994.

Sun's SPARCcenter 2000E brochure, Sep., 1994.

Silicon Graphics brochure, 1994.

NEC Express RISCserver brochure, Mar., 1994.

Motorola PowerStack Series MP Models MP601–75–2 and MP601–75–4 brochure, 1994.

Worldwide Information Systems Bull Escala Symmetric Multiprocessor brochure.

Artecon Sphinx SPARC brochure.

Compaq Overview of Rack–Mountable Compaq ProLiant brochure.

Dell Advanced Solutions Capabilities Guide, 1994.

Digital Alpha AXP Systems Summary brochure, Apr. 1994.

Cubix BC Series Single Board Computers, QL Series Host Communications Processors, Intelligent Environmental Sensor brochure, Apr. 1994.

Newbridge Network Products and Support brochure, 1994.

Hewlett Packard Series 6000 SCSI Mass Storage Systems for HP Computers brochure, 1993.

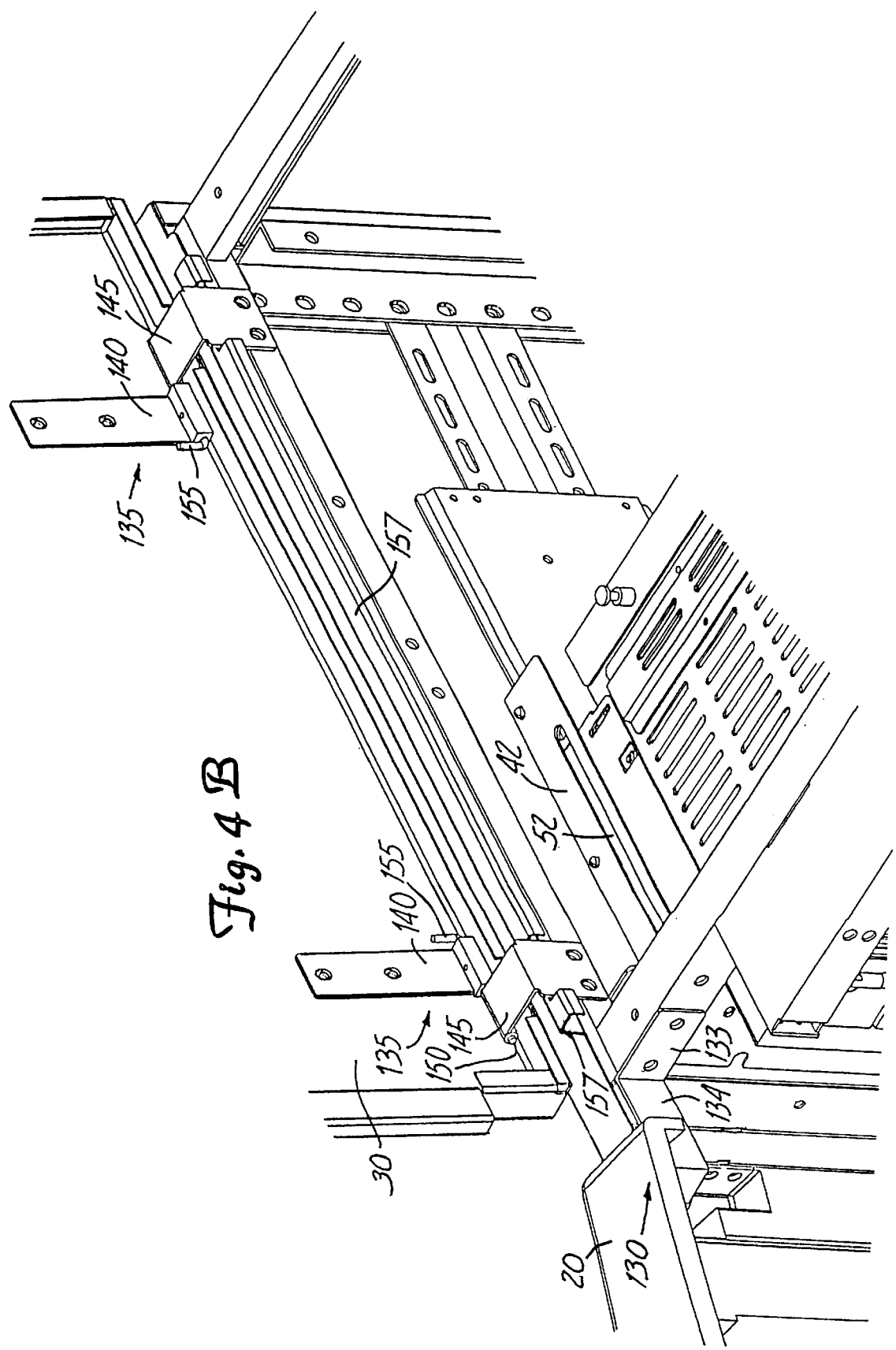

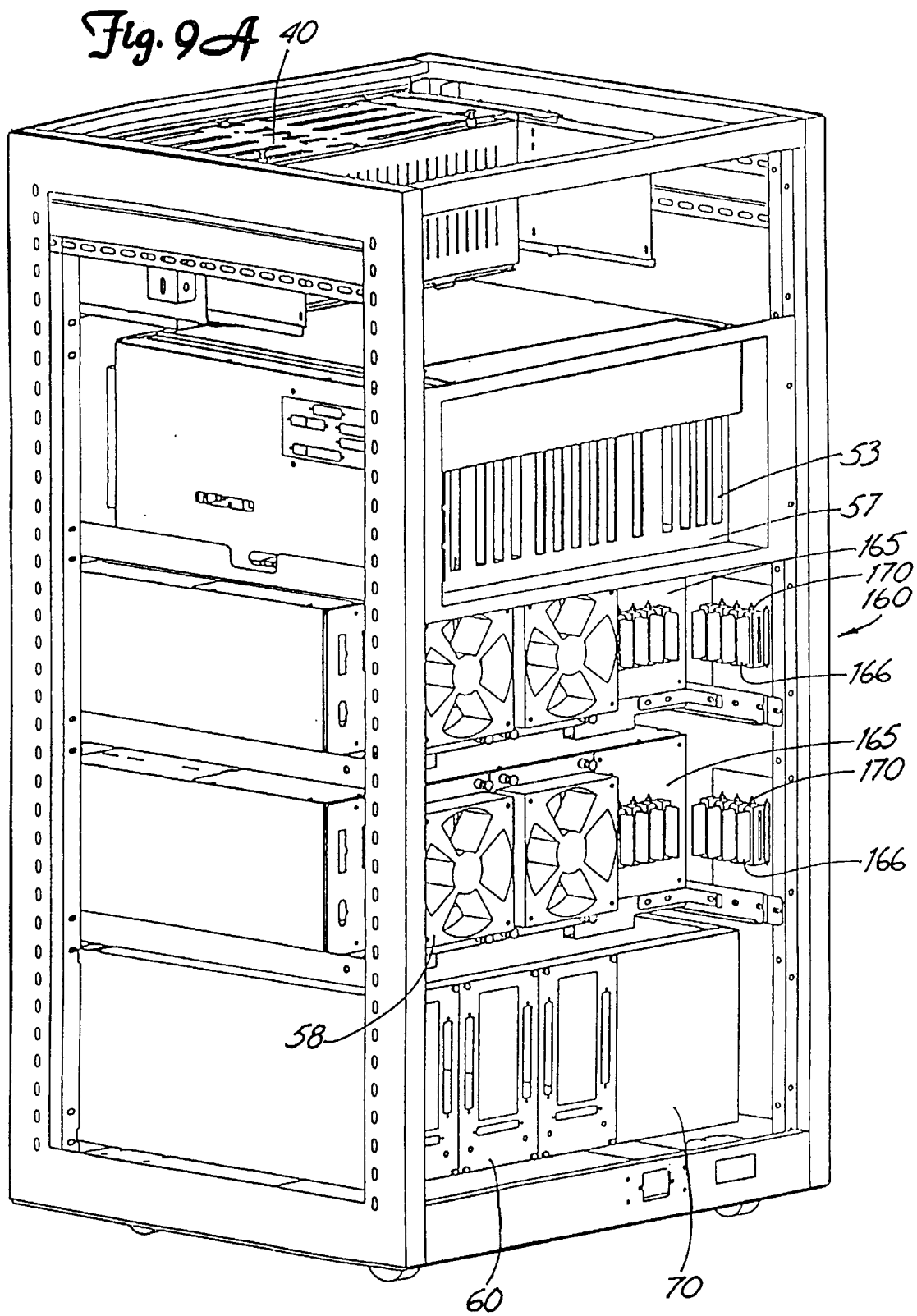

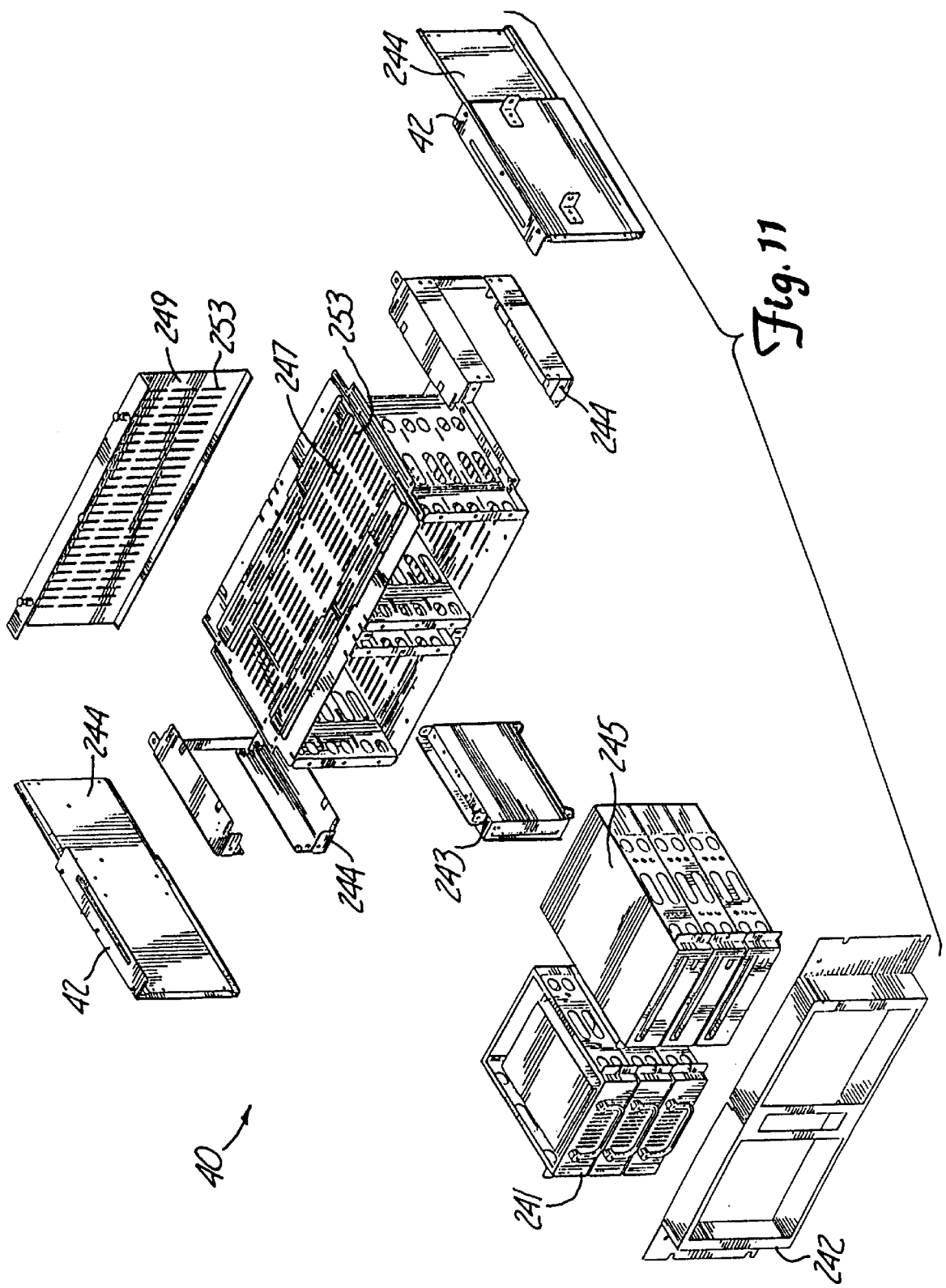

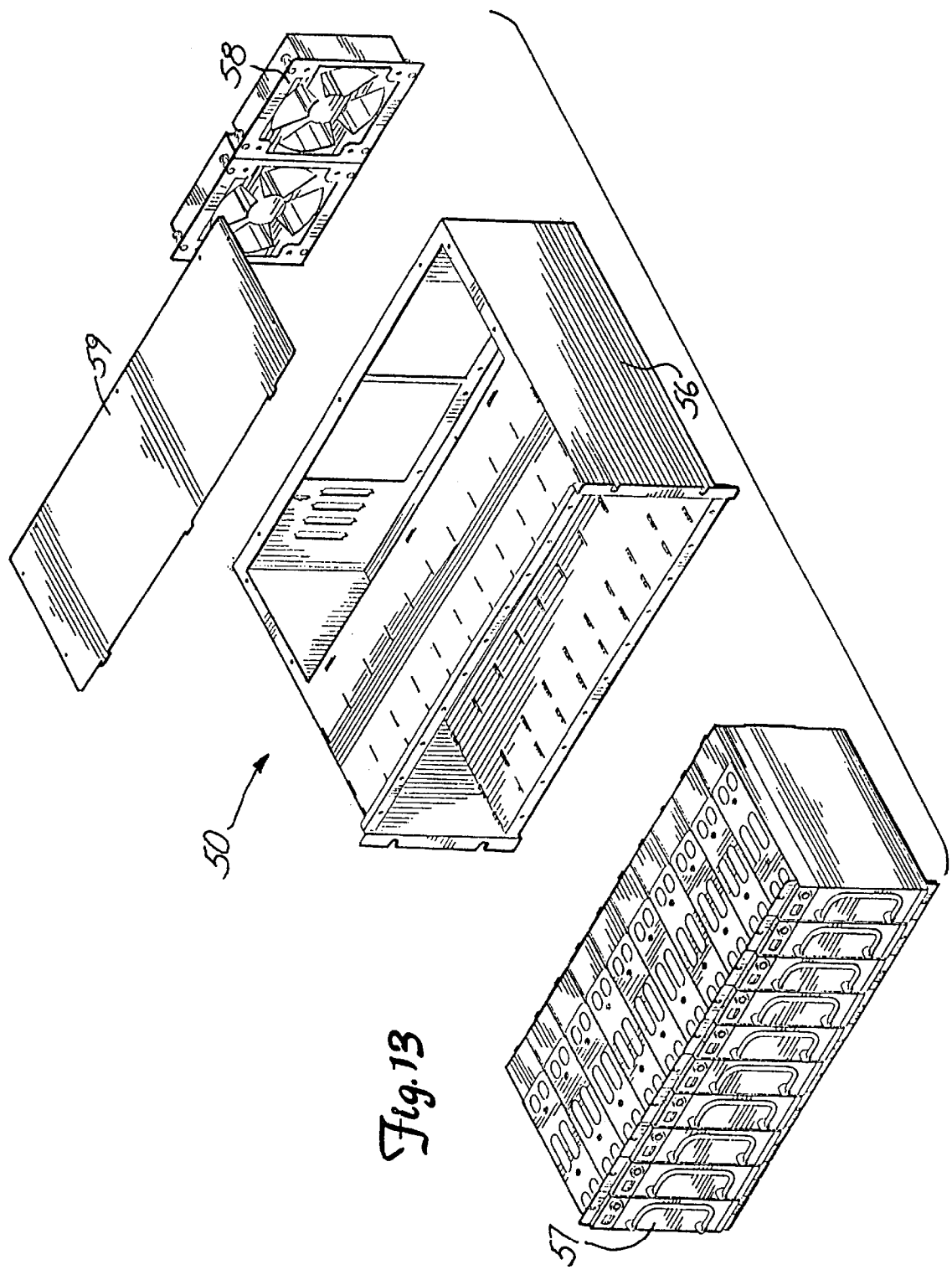

PACKAGING ARCHITECTURE FOR A DATA SERVER

This is a Division of application Ser. No. 08/518,003, filed Aug. 22, 1995, now U.S. Pat. No. 5,684,671.

CROSS-REFERENCE TO RELATED APPLICATIONS

The subject matter of this application is related to the subject matter of commonly assigned, concurrently filed U.S. Design Application No. 29/042,986, now U.S. Pat. No. D377,785 (Atty. Docket No. 1451.06-US-01), which is incorporated herein by reference.

BACKGROUND OF THE INVENTION

1. Field of the Invention

The invention relates to computing devices, and more particularly, to packaging architectures for arranging and enclosing data server components.

2. Description of Related Art

Data servers are well-known in the art for linking computing resources within networks. Data server components, including hard disk drives, peripheral storage devices, power supplies, and logic components, are available in a variety of configurations.

A number of prior art data server configurations waste significant internal space, and thus are unnecessarily large, because the data server components are significantly spaced apart to allow room for repair and replacement tasks. Up to 40% of the internal space in some servers is empty, and thus wasted, for the sake of easy serviceability. Other configurations sacrifice ready access and serviceability for compactness, and are consequently extremely difficult to repair and maintain. Some smaller servers, for example, place peripheral storage devices and a logic chassis at the same level within the server, necessitating disassembly and/or removal of the storage devices to service the logic chassis, and vice versa. Additionally, many internal components of certain data servers can be accessed only from the side of the server for repair and/or maintenance. Accessing these components through the side of the server necessitates a two-to-three foot space between adjacent servers, rolling a server away from an adjacent server, and/or disconnecting a server from its power source. A need has arisen, therefore, for a data server that is both compact and serviceable, and that does not require side access for standard repair and maintenance.

Other typical data server configurations present a significant disadvantage in that the data server components that are accessed and used most often, e.g. peripheral storage devices, are placed at least partially at an operator-inconvenient location. Locating peripheral storage devices at floor level, for example, requires an operator to stoop down to supplement, swap or service the peripheral storage devices. A need has arisen, therefore, for a more user-friendly data server providing easier access to often-used components.

Additionally, many prior art servers are vulnerable to unauthorized access at a number of points, and/or provide inadequate safety/warning devices to indicate that access is being attempted to the interior of the data server which potentially could compromise the integrity of data stored on the server. A need has arisen, therefore, for a data server that minimizes the number of access points while providing effective securement and monitoring of those access points.

In this regard, most prior art servers fail to prevent unauthorized removal of the server doors. A need has thus arisen for a server that simply but effectively prevents unauthorized door removal and/or access to the interior of the server.

Finally, a number of prior art servers fail to adequately control airflow through and past essential components of the server, causing heat buildup and thermal-induced failure. Recirculation of warm air through the server, for example, has been problematic in a number of previous devices. A need has arisen, therefore, for a server that provides better air circulation and thus more effectively cools the data server components.

SUMMARY OF THE INVENTION

To address the above and other disadvantages, a rack-mount data server according to an embodiment of the invention includes a housing, a plurality of data server components supported by the housing, and a plurality of racks coupled with the housing to accommodate the data server components. The data server components include at least one peripheral storage device, a logic chassis for the data server, at least one disk drive on which the data server stores files, and at least one power supply. The racks coupled with the housing include a first, topmost rack accommodating the at least one peripheral storage device, and a second rack accommodating the logic chassis. The housing supports the second rack underneath the first rack as the second-topmost rack.

According to one embodiment, the first rack is supported by the housing to move from a housed position within the housing to an extended position at least partially outside the housing, allowing access to the logic chassis from the top of the data server. This embodiment also preferably includes a plurality of slides, the first rack being mounted on the slides to move linearly to its extended position. Additionally, the logic chassis preferably includes a movable cover, which is swingable to an open position when the first rack is moved to its extended position. The cover preferably is pivotally mounted to the logic chassis to swing into a space that was occupied by the first rack in its housed position. In this way, the present invention allows for more current operation access to peripheral storage devices by locating them in the first on the top of the housing, while still allowing easy access to the logic chassis located on the second rack.

According to another aspect of the invention, a rack-mount data server embodiment includes a housing, a plurality of data server components, a plurality of racks coupled with the housing to accommodate the data server components, and front and top doors. The top door and the front door are interlockable with each other, such that when the top door and the front door are closed, one of the top door and the front door locks the other of the top door and the front door in its closed position. According to one embodiment, the front door includes a lip and the top door includes an abutting surface, such that the lip of the front door overlaps the abutting surface of the top door to prevent the top door from opening. In this way the present invention provides a mechanism to effectively prevent unauthorized door removal.

This data server embodiment also preferably includes at least one detection device, coupled with the front door and/or the top door and with a system management unit of the data server. The detection device preferably signals the system management unit upon attempted access to data server components from outside the data server via the door. According to various embodiments, the detection device signals the system management unit when the door is unlocked and/or opened. Further, the detection device preferably includes a microswitch, but alternatively can include other similar components. Additionally, this data server embodiment preferably includes a system interrupt switch, such as a system reset switch or a system abort switch, for example. The system interrupt switch preferably is placed so as to be accessible only via one of the top door and the front door.

Also according to this embodiment, at least one detection device preferably is coupled with a peripheral access door that allows access to at least one peripheral storage device of the data server. The detection device preferably signals the system management unit upon attempted access to the peripheral rack via the peripheral access door. Further, the data server preferably includes a detection device coupled with a cover of a logic chassis of the data server, to signal the system management unit upon attempted access to the logic chassis via the cover. The logic chassis preferably includes a plurality of printed circuit modules that are inaccessible from the back of the data server.

According to another aspect of the invention, a rack-mount data server embodiment includes a housing, a plurality of data server components, a plurality of racks to accommodate the components, and a front door covering the front side of the housing. The front door preferably includes a mesh structure on at least a portion of an exterior surface, to allow airflow through the front door. A plurality of fans are positioned to move air from outside the front of the data server housing, through the mesh structure of the front door, and toward the back side of the housing. At least one of the fans preferably includes a fan speed sensor to signal the system management unit of the data server upon deviation of fan speed from a predetermined level. The mesh structure preferably extends a majority of the length of the front door to allow airflow therethrough, and the mesh structure preferably includes at least one screen.

According to another aspect of the invention, a side-by-side arrangement of multiple rack-mount data servers includes a plurality of immediately adjacent data servers arranged side-by-side to form a row of data servers. Each data server includes a housing, a plurality of data server components including a plurality of disk drives, a plurality of racks accommodating the data server components, a front door, and at least one hinge coupled with the front door and with the housing to cause the front door to open without interfering with an immediately adjacent data server. The disk drives preferably include a plurality of plug-and-play disk drives. Each data server according to this embodiment also preferably includes a top door having at least one hinge to cause the top door to open without interfering with an immediately adjacent data server. In this way, multiple servers in accordance with the present invention can be positioned side-by-side without requiring the user to move the servers to allow for side panel access when service is required.

According to another aspect of the invention, a rack-mount data server includes a housing, a plurality of data server components, a plurality of racks to accommodate the data server components, and a front door. The data server according to this embodiment also preferably includes at least one hinge to cause the front door to move to an open position without interfering with an immediately adjacent data server. The hinge preferably defines a substantially vertical pivot axis passing through an edge of the front door. The data server also preferably includes a top door and associated hinge to cause the top door to open without interfering with an immediately adjacent data server. The hinge preferably includes a stepped section and the front door preferably includes a protrusion, the protrusion being located within the stepped section to prevent vertical removal of the front door when the front door is in its closed position. The protrusion preferably is removed from the stepped section to allow vertical removal of the front door when the front door is in its open position.

Other important aspects and embodiments, such as, but not limited to, spill resistance, internal wiring arrangements, I/O channel/disk drive connections, and the construction and loading of the disk drive racks and other racks, will be described below.

BRIEF DESCRIPTION OF THE DRAWINGS

Embodiments of the invention will be described with reference to the Figures, in which like reference numerals denote like elements and in which:

FIG. 4B is a perspective, close-up view of a top portion of the FIG. 1 data server;

FIG. 9A is a rear perspective view similar to FIG. 9 but illustrated with additional features;

FIG. 11 is an exploded view of the FIG. 10 peripheral rack;

FIG. 13 is an exploded view of the FIG. 12 rack;

DETAILED DESCRIPTION OF PREFERRED EMBODIMENTS

This application describes and illustrates data server packaging architecture in various arrangements, including skinson, skins-off, doors-open and doors-closed arrangements. The invention, however, is not necessarily limited to data servers. On the contrary, embodiments of the invention have application to a wide variety of computing hardware, not just data servers. Therefore, while preferred embodiments of the invention will be described with respect to data servers and data server architecture, the invention is not necessarily limited to these devices.

Figure 1:
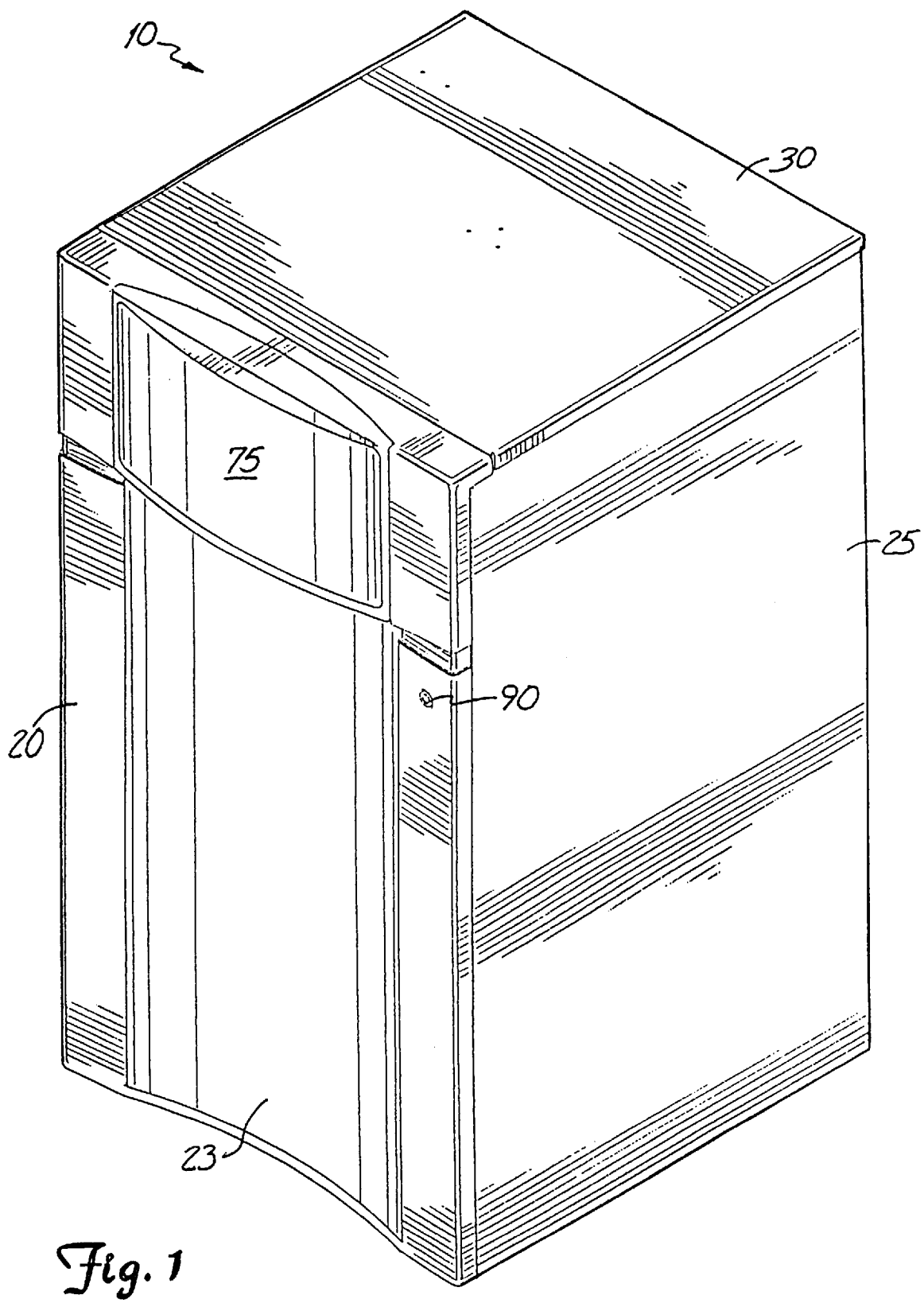
FIG. 1 is a perspective view of a data server with external skins on, according to an embodiment of the invention.
Figure 2:
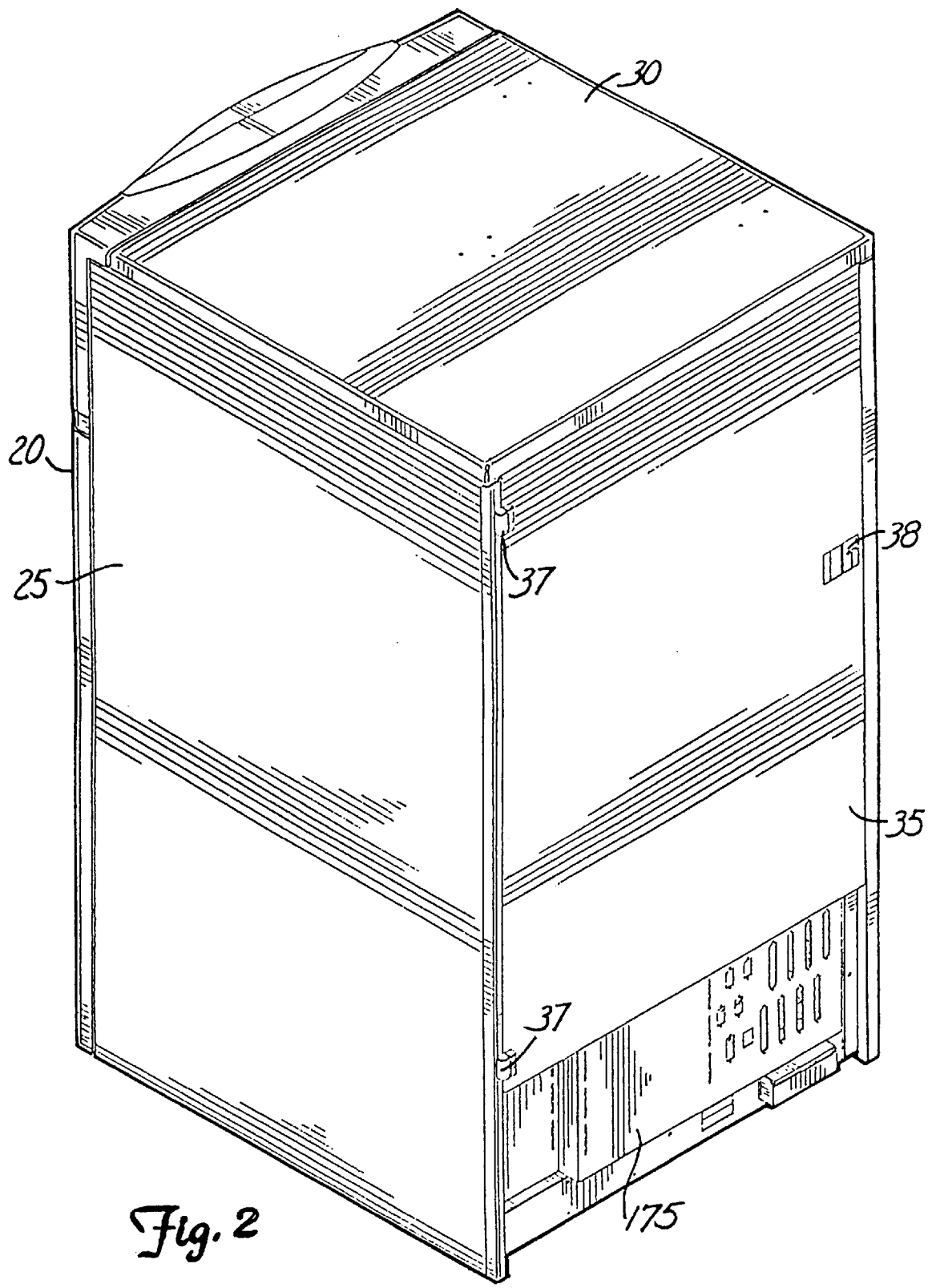
FIG. 2 is a rear perspective view of the FIG. 1 data server.
Figure 3:
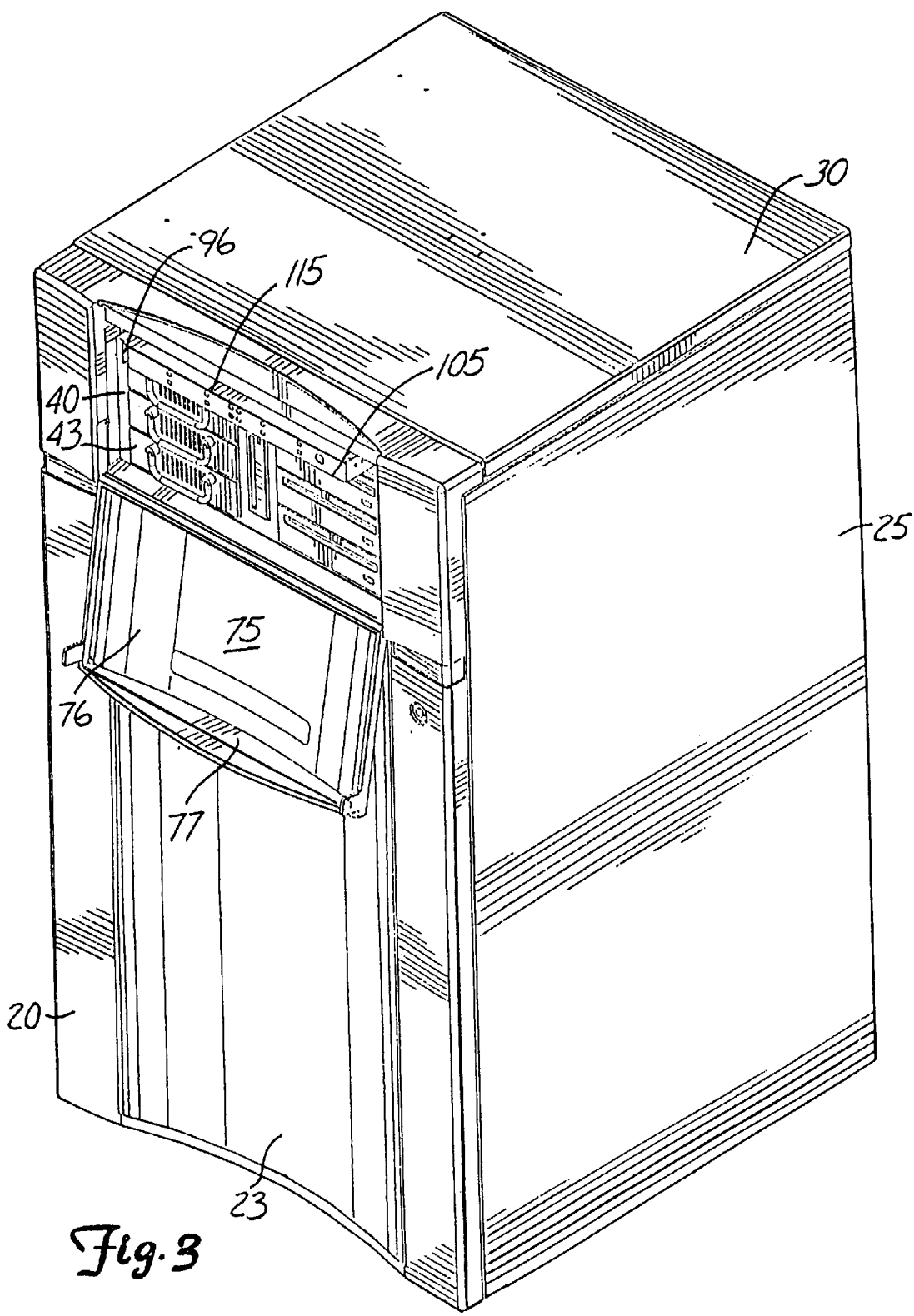
FIG. 3 is a perspective view of the FIG. 1 data server with a peripheral access door in an open position.
Figure 4:
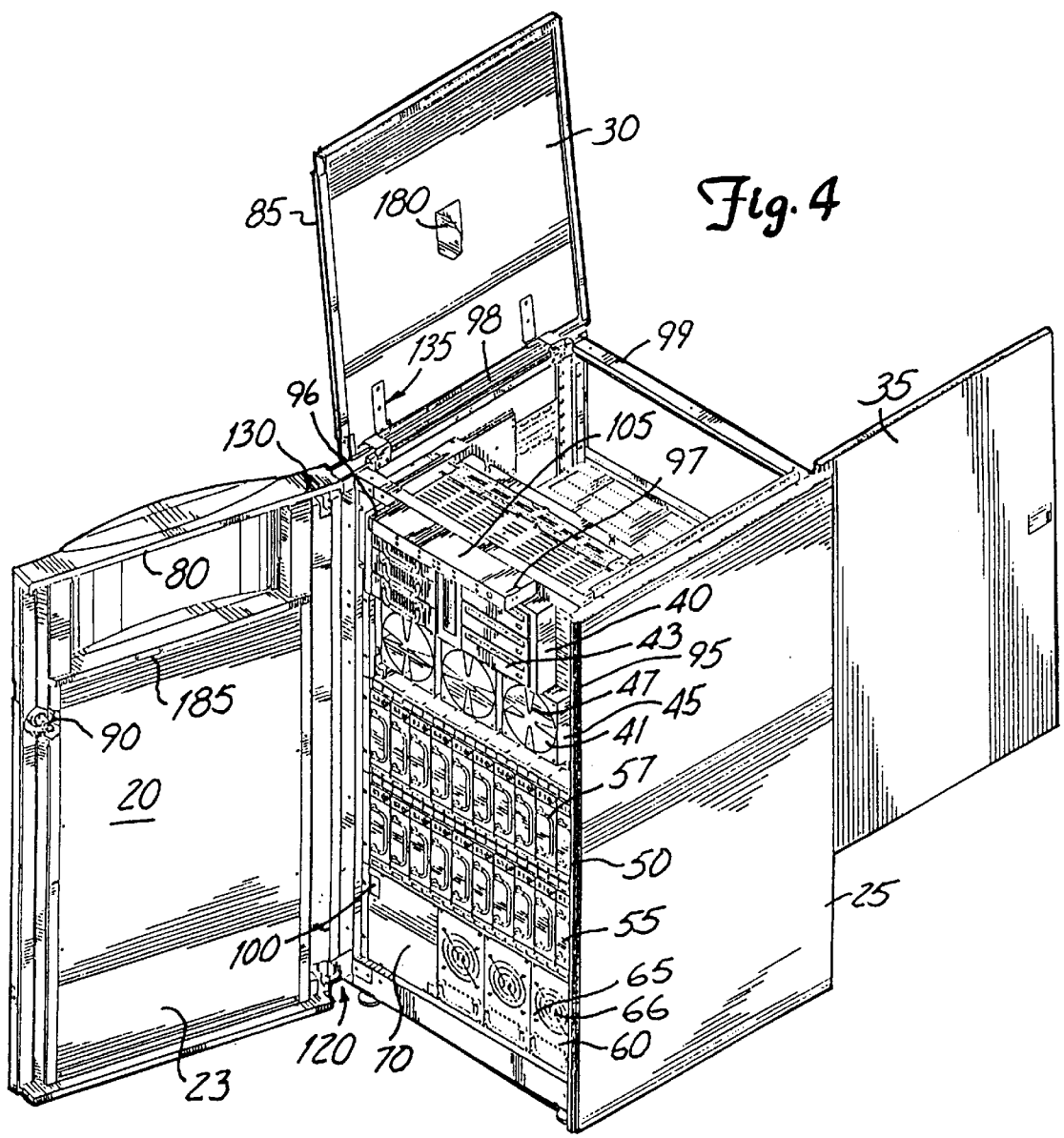
FIG. 4 is a perspective view of the FIG. 1 data server with top, front and rear doors open.
Figure 5:
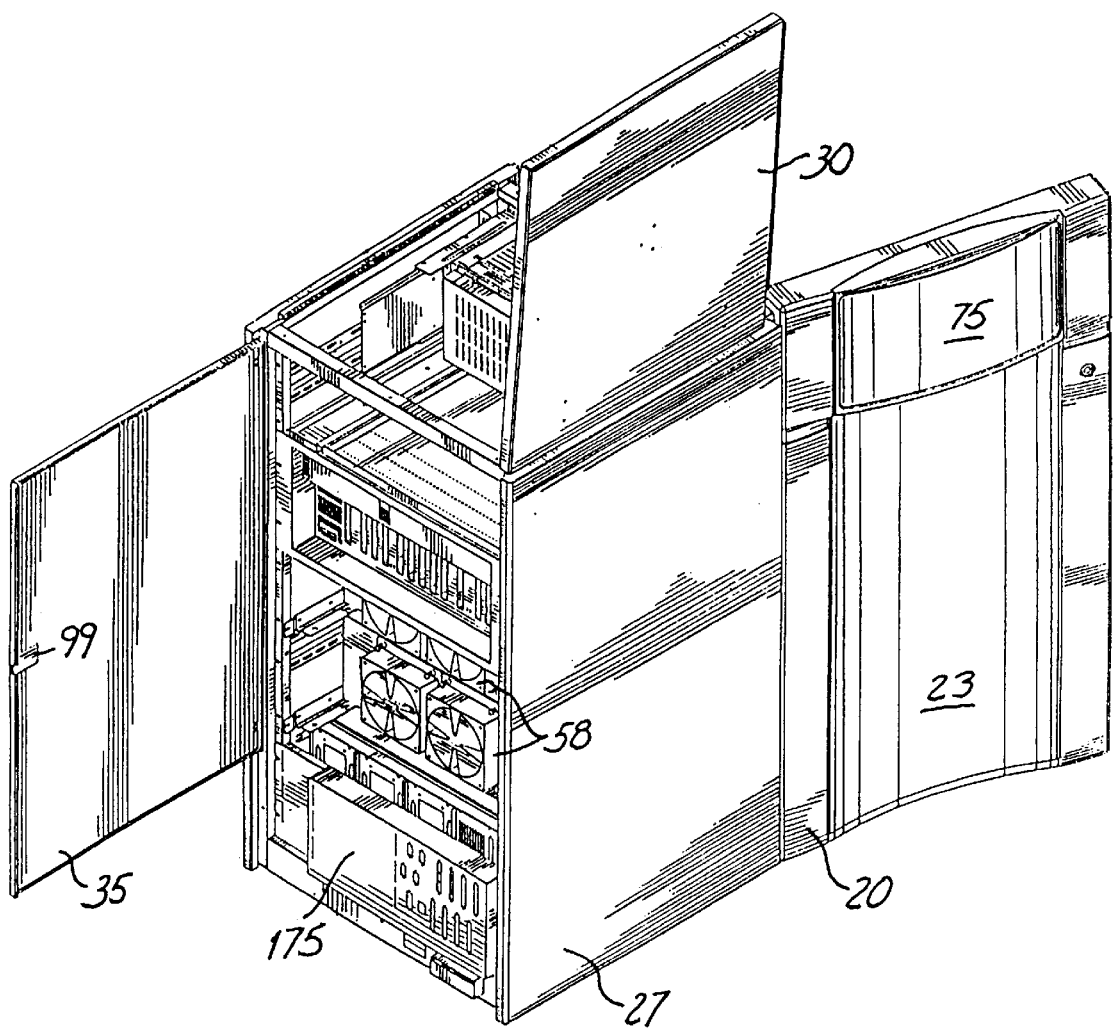
FIG. 5 is a rear perspective view of the FIG. 1 data server with top, front and rear doors open.

FIGS. 1–9A of the application show rack-mount data server 10, with a plurality of skins covering internal housing frame 15 (FIG. 8) to provide an outer surface of data server 10. The skins include front door 20, rear door 35, top door/lid 30, right side wall 25, and left side wall 27 (FIG. 5). In its closed position (e.g. FIG. 1), front door 20 covers the front side of housing 15, and in its open position (e.g. FIG. 4), front door 20 allows access to internal components of data server 10, to be described below, from the front side of housing 15. Similarly, top door 30 is positioned to cover the top side of housing 15 when top door 30 is in a closed position and to allow access to at least one of the data server components from the top side of housing 15 when top door 30 is in an open position.

According to one embodiment, front door 20 is formed of a molded plastic, although other materials, such as urethane, for example, also are contemplated according to the invention. Additionally, front door 20 preferably is provided with at least one mesh structure 23, such as a screen, to provide a macro-filter that keeps large particulate matter out of data server 10. Mesh structure preferably extends over a majority of the length of front door 20, for example approximately ¾ of the length, but of course could also extend less than a majority of the length. To better filter incoming air, mesh structure 23 preferably includes two superposed screens, the combination of which also produces an aesthetically pleasing patterned effect, e.g., a moiré effect.

Right side wall 25, left side wall 27, top door 30 and rear door 35 all preferably are formed of sheet metal, although, as with front door 20, alternative materials are also contemplated. The sheet metal preferably is zinc-plated and then painted, to maximize endurance and aesthetic appeal, or can be left bare or provided with other coatings.

Front door 20 preferably is opened by inserting a proper key into lock 90. Of course, other, non-key locking mechanisms also can be used. Although rear door 35 of the illustrated embodiment is opened merely by sliding latch 38 to one side, a locking rear door also is contemplated according to the invention. Top door 30 preferably does not include a dedicated locking mechanism. According to the illustrated embodiment, however, top door 30 is held in its closed position by front door 20, as will be described.

Rear door 35 is designed to swing between open and closed positions on external hinges 37 (FIG. 2), and also is designed for easy removal from housing 15. For purposes of this description, for rear door 35 as well as for front and top doors 20, 30, the term "open position" should be interpreted to mean open and attached to housing 15, or partially or completely removed therefrom.

Behind its doors 20, 30, 35 and side walls 25, 27, housing 15 of data server 10 supports a plurality of data server components contained within a computer unit. Data server 10 preferably includes a plurality of racks, five in the illustrated embodiment, each of which can be associated with a different function of the data server. Of course, a number of racks other than five also can be provided, and multiple racks can be associated with a single function or a single rack can be associated with multiple functions.

Although the configuration and positioning of the various racks in typical rack-mount data servers waste a large amount of space, data server 10 according to the invention maximizes efficient space usage and thus improves upon the standard way of thinking in the art, while still maintaining a "look" that does not necessarily stand out as unusual.

The racks of data server 10 will now be described in greater detail. Topmost rack 40 (FIG. 4) preferably is a peripheral rack that accommodates at least one peripheral storage device 43, such as one or more floppy disk drive, CD ROM drive, boot drive, tape drive, and/or other peripheral storage devices, especially peripheral storage devices that require user access in the form of insertion or withdrawal of a storage medium from the peripheral storage device. Front door 20 preferably includes peripheral access door 75, which in the illustrated embodiment is hinged on front door 20 to swing down and expose peripheral devices 43, as shown, for example, in FIG. 3. Peripheral access door 75 also can be completely removable from front door 20. Given the frequency with which peripheral devices are generally accessed, peripheral door 75 typically is not locked. Of course, however, a lock could be provided to create a more secure environment. According to one embodiment, peripheral door 75 is composed primarily of an at least semitransparent plexiglass 76, surrounded by molded frame 77, although of course other materials and/or material combinations also are contemplated.

Immediately under peripheral rack 40 in the embodiment shown in FIG. 4, for example, is logic chassis 45, also referred to as a card cage rack. Card cage rack 45 supports card cage 47, which includes a plurality of printed circuit modules that provide the basic logic functions for the data server and generally are among the most valuable components of the machine. To cool the modules, card cage rack 45 preferably includes a plurality of fans 41, to be described in greater detail below.

Beneath card cage rack 45, housing 15 supports disk drive racks 50, 55. Racks 50, 55 do not have to be completely populated with disk drives, although they are completely populated in the illustrated embodiments. In the event a user of data server 10 desires to use only a portion of the possible total population, the empty space created by the absence of one or more disk drives 57 preferably is covered by a flat plate or other object, although of course the empty space can also be left open. Disk drives 57 preferably are of the plug-and-play type and preferably are hot-swappable, meaning that they can be replaced upon failure without turning off data server 10. Although two disk drive racks 50 are provided according to this embodiment, a single rack 50 or three or more racks 50 also can be provided according to the invention.

Beneath disk drive racks 50, power supply rack 60 supports a plurality of hot-swappable power supplies 65, also referred to as power supply elements, as well as system management unit 70. System management unit 70 includes a maintenance/management computer that performs a number of functions, as will be described. Between one and three power supplies 65 can be provided, depending upon the degree of redundancy desired and on the amount of power drawn by data server 10. Generally, the maximum number of power supplies 65 required by data server 10 is two, so that a third power supply 65 can be provided to create redundancy. The heavier components of data server 10, i.e., power supplies 65, system management unit 70, and disk drives 57, are placed low in the machine to keep the overall center of gravity lower and thus provide greater stability.

As shown in the Figures and as described above, peripheral rack 40 preferably is a topmost rack, and card cage rack 45 preferably is located immediately underneath peripheral rack 40. This positioning is very convenient for the user and represents a significant improvement over many prior art devices, because peripheral rack 40 typically is the portion of data server 10 that is accessed most often. Users typically access peripheral rack 40, for example, to replace/reload a back-up drive or a floppy drive, to copy data on or off data server 10, or to load new software. Placing peripheral rack 40 at the topmost position of data server 10 makes rack 40 much more convenient to access, whether the user is standing or sitting, and eliminates the need for the user to bend down to the floor, for example.

Of course, access to card cage 47, which as described above includes many valuable components, also is important. Therefore, peripheral rack 40 advantageously is mounted on slides 42, to linearly move from a housed position, at least partially within housing 15, to an extended position, at least partially outside housing 15. Note, for example, arrows 44 in FIG. 6, which show the linear movement of peripheral rack 40 from its housed position toward its extended position.

Sliding peripheral rack 40 from its housed position to its extended position allows access to logic chassis 45 from the top of data server 10. Logic chassis 45 preferably includes cover 46, pivotable on hinge 49 (FIGS. 16–17) in the direction of arrow 48 (FIG. 6) when peripheral rack 40 is moved out of the way to its extended position. Upon swinging logic chassis cover 46 to its open position, logic chassis 45 is fully accessible from the top of data server 10.

The sliding peripheral rack and underlying card cage according to the invention overcome a number of disadvantages associated with prior art machines. In most prior art machines, the card cage rack is located as the topmost component for two reasons: (1) to facilitate access to the logic chassis through the top or front of the machine, and (2) to increase heat dissipation, as most of the heat energy is generated by the logic chassis. If, for example, card cage rack 45 were immediately behind peripheral rack 40 instead of underneath it, accessibility would increase, but the overall footprint of the machine would also increase. Alternatively, if peripheral rack 40 and card cage rack 45 were spaced sufficiently to allow better access to each, up to 30–40% empty space inside the housing would result. Serviceability and accessibility, therefore, would come at the expense of compactness. By placing card cage rack 45 underneath peripheral rack 40 and providing structure to allow peripheral rack 40 to slide linearly to an extended position, data server 10 according to the invention combines compactness and serviceability in a manner unmatched in the prior art.

Figure 18:
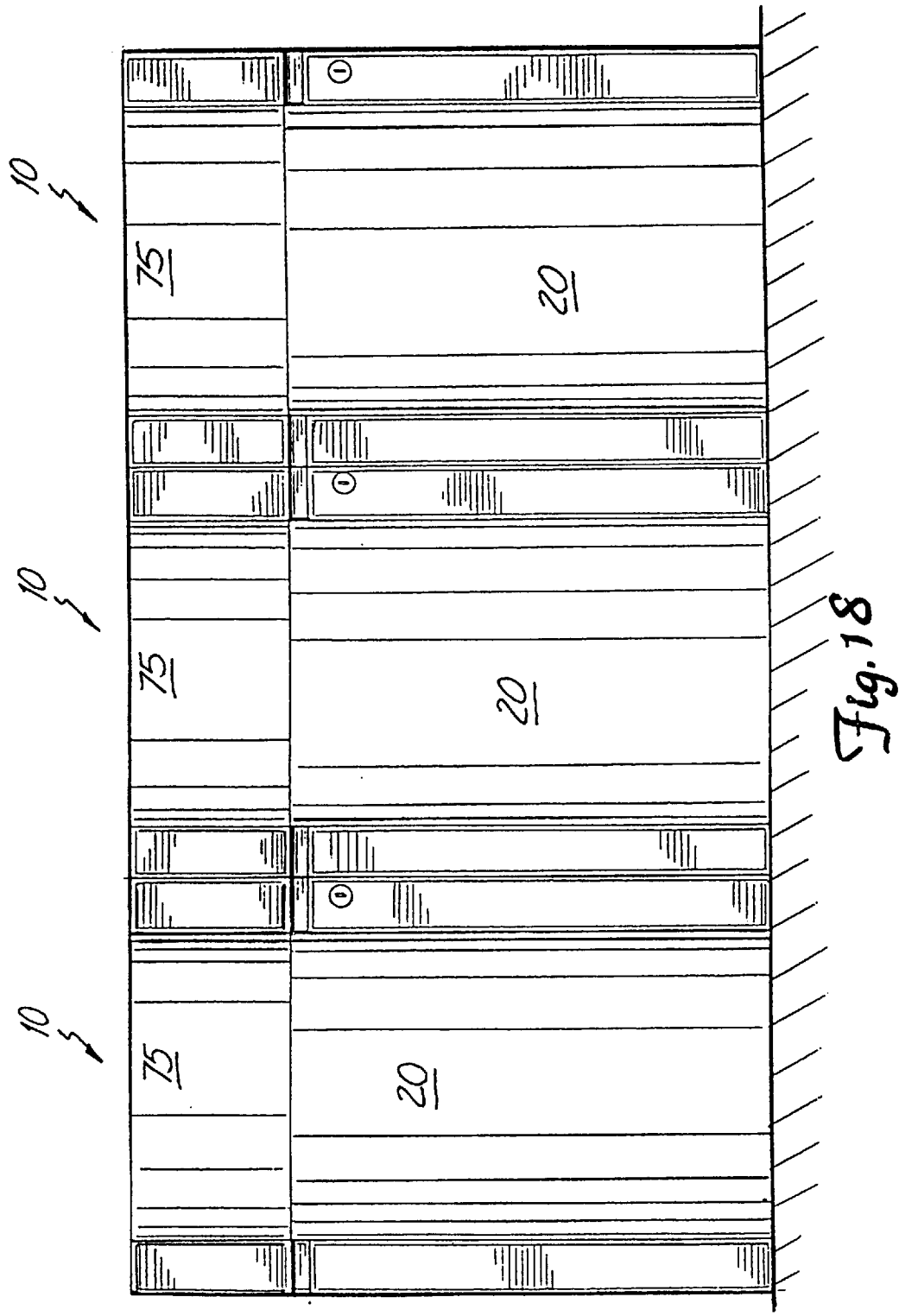
FIG. 18 is a front view of a side-by-side arrangement of multiple rack-data servers according to one embodiment of the invention.
Figure 19:
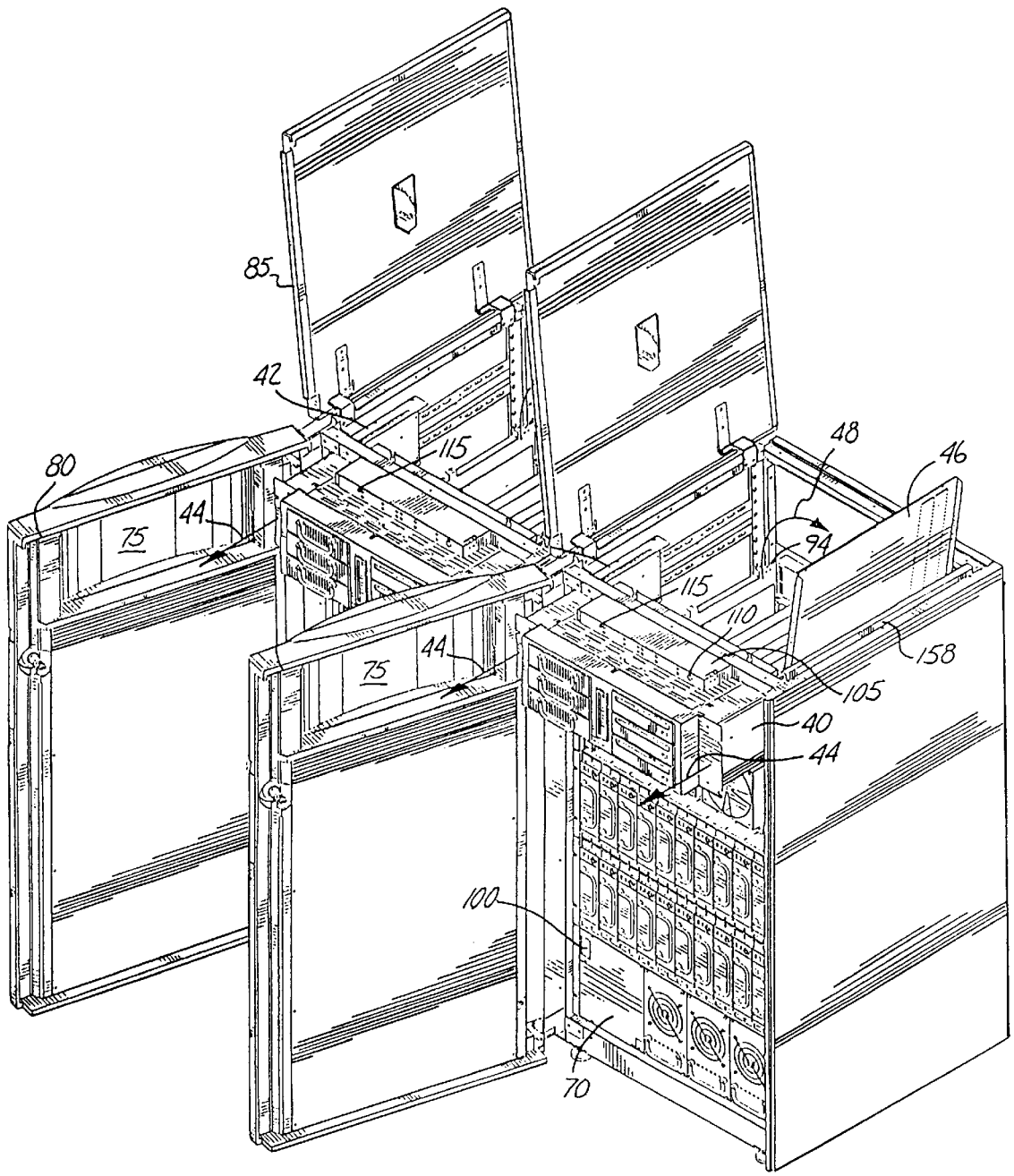
FIG. 19 is a perspective view showing a side-by-side data serve arrangement with open, non-interfering doors.

The racks and rack-mounted components of data server 10 preferably are one hundred percent serviceable from the front, top and rear sides of the data server, via front, top and rear doors 20, 30 and 35. For the most common servicing that data server 10 is likely to require in its lifetime, therefore, no access through side walls 25, 27 will be necessary. This also represents a significant advantage over prior art machines. Because no access via side walls 25, 27 is required, a plurality of immediately adjacent data servers 10 can be arranged side-by-side to form a row 12 of data servers, as shown, for example, in FIG. 18. Unlike many prior art data server arrangements, in which 3–6 feet of space is required between machines and/or the machines have to be unplugged and rolled out of the row for service, data servers 10 according to the invention can be arranged immediately adjacent to one another, even touching each other, and still be one hundred percent serviceable without being moved. To allow top and front doors of data server 10 to be swung open without interfering with an immediately adjacent server or other object, as shown in FIG. 19, each door includes a preferred hinge arrangement, as will be described.

To prevent unauthorized access to the data server components through top door 30, front door 20 and top door 30 preferably overlap, so that top door 30 physically cannot be opened until front door 20 is unlocked and opened. Front door 20 preferably includes lip 80 (as shown in FIG. 4) at its upper rear side, and top door 30 preferably includes an abutting surface or flange 85, preferably at its front side. When top door 85 is in its closed position and front door 20 is then closed, lip 80 overlaps abutting surface 85 to prevent top door 30 from opening. Thus, both top door 30 and front door 20 are effectively secured by a single lock 90. According to a reverse embodiment, however, top door 30 can include a lock and be configured with a lip, to overlap and/or engage a protruding surface on front door 20 and thereby prevent front door 20 from opening. Thus, top door 30 and front door 20 are interlockable with each other, such that when top door 30 and front door 20 are in their closed positions, one of top door 30 and front door 20 locks the other of top door 30 and front door 20 in its closed position. Thus, one lock, 90 in the illustrated embodiment, controls access to both the front and top of data server 10.

Data server 10 also preferably includes one or more detection devices, such as microswitches, coupled with various selected doors and/or locks to detect attempted access to the internal components of data server 10 from the outside. According to one embodiment, the detection devices signals system management unit 70 upon unlocking and/or opening of a door, indicating that an attempt at access is occurring. System management unit 70 then can take appropriate action, chosen by the operator, such as signaling one or more persons or other computing devices, lighting one or more lights 115 on light bar 105 (e.g., FIGS. 3 and 6), initiating a complete or partial power-down of the machine, alerting law enforcement agencies, altering the physical characteristics of the room in which the data server is located, or taking other appropriate and/or preventive action.

In the example of the illustrated embodiment, data server 10 preferably includes one or more of the following detection devices: device 95 (e.g. FIG. 4), which detects unlocking of front door 20, device 97 (e.g. FIG. 4), which detects opening of front door 20, device 98 (e.g. FIG. 4), which detects opening of top door 30, device 99 (e.g. FIGS. 4 and 5), which detects opening of rear door 35, device 96 (e.g. FIGS. 3 and 4), which detects opening of peripheral door 75, and/or device 94 (e.g. FIG. 6), which detects opening of card cage lid 46. Although devices 94 and 96–99 are shown in specific locations in the illustrations, alternative placements, at a variety of locations, are also contemplated.

Figure 6:
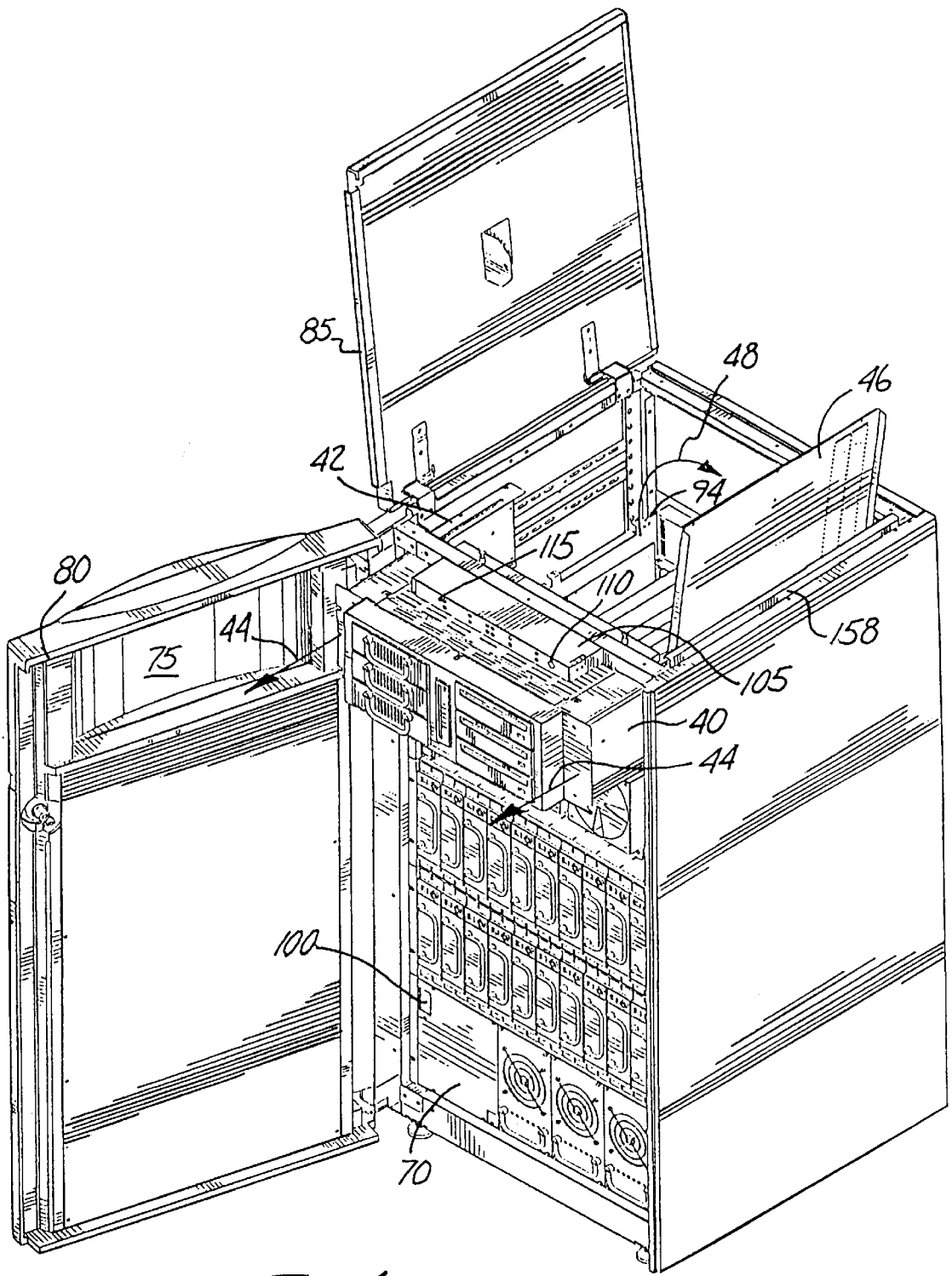
FIG. 6 is a perspective view of the FIG. 1 data server showing movement of the peripheral rack and card cage lid, according to one embodiment.

Typically, the components of data server 10 that are the most important to protect are located behind front door 20, and are accessible only after unlocking and opening front door 20. For example, hard disk drives 57 and system management unit 70 are both relatively expensive and are most susceptible to unauthorized outside access to the data files being stored on data server 10. Therefore, hard disk drives 57 and system management unit 70 are accessible only upon unlocking and opening front door 20. System interrupt switches, such as system reset switch(es), system abort switch(es), and/or system off switch(es), also are behind front door 20, preferably at location 100 as shown in FIG. 6. On-switch 110 is on light bar 105 and thus accessible through peripheral door 75 without opening front door 20, according to the illustrated embodiment, because data typically cannot be corrupted by turning data server 10 on. Alternatively, however, on-switch 110 also can be located behind front door 20, and/or an off switch can be located so as to be accessible without opening front door 20.

The internal modules of card cage 47 and other such components are accessible only through top door 30, but top door 30 is not openable until front door 20 is opened, as described earlier. By placing the most critical and valuable components and switches under lock and key, and by constant monitoring of the locked and/or closed states of the doors by the detection devices, data server 10 according to the invention achieves significant security advantages over the prior art.

To prevent data server 10 from overheating, thermal controls are employed to maintain internal temperatures within a desired range. To this end, data server 10 includes a plurality of fans, positioned at the front and rear sides of housing 15, to move air from outside the front of housing 15, through mesh structure 23 in front door 20, toward the rear of housing 15, and finally through a plurality of vents (not shown) in rear door 35. By providing a front-to-back airflow instead of back-to-front or bottom-to-top airflow, as in many prior art devices, very little if any heated air is recirculated into the server from the area immediately behind it, or is recirculated within the server from rack to rack. Instead, cold air is pulled off the front of the machine and transferred out the back of the machine, without significant mixing of ambient cool air with heated air. This becomes especially important when data server 10 is located in a room without traditional computer-room air controls, such as a personal office, or even a room without any air conditioning whatsoever.

FIG. 4 illustrates a number of fans at the front of server 10. Each power supply 65 preferably includes its own fan 66, for drawing air from the front of the server and directing it toward the rear of the server through the power supplies. Card cage rack 45 also supports a plurality of fans 41, moving air from the front of the machine, through card cage 47 and toward the rear. At the rear of server 10, as shown in FIG. 5, for example, each disk drive rack 50, 55 supports a plurality of rear-mounted fans 58, which draw air from inside the disk drive racks, and thus from the front of disk drive racks 50, 55, and transfer it out the rear of the machine. Thus, in a full-fan configuration, data server 10 includes a total of ten fans: three card cage fans 41 and three power supply fans 66 at the front of the machine, and four disk drive rack fans 58 at the rear of the machine. Of course, other numbers and arrangements of fans also are contemplated.

Although peripheral rack 40 is generally convection cooled and includes a number of vent holes in door 75, for example, which allow some minimal airflow to escape out the front of the machine due to back pressure within the machine, the primary airflow generated by the up to ten fans of the data server is front-to-back.

Disk drive rack fans 58 preferably are hot-swappable and/or redundant. Thus, for example, although two fans 58 are provided for each disk drive rack 50, 55, each rack needs at a minimum only one of the two fans to cool properly. Further, a malfunctioning fan can be changed without shutting off the power to data server 10. Each fan preferably includes a dead-fan sensor that is continuously monitored by system management unit 70. Upon detecting failure one of fans 58, an appropriate alarm is sounded and/or an operator is otherwise notified.

Each card cage fan 41 preferably services approximately one-third of card cage 47. These fans generally are not redundant, according to one embodiment, and therefore each preferably includes a tachometer that records r.p.m.'s and, upon deviation of fan speed from a predetermined norm, signals system management unit 70 that failure is imminent. System management unit 70 can, in addition to signaling an operator in the event of fan failure, power-down the machine once one or more fans 41 have been functioning inadequately for a given period of time. Fans 41 preferably are hot-swappable and, of course, can be chosen and positioned to provide redundancy if so desired.

Preferably, system management unit 70 continuously monitors all fans of data server 10, except the power supply fans according to a preferred embodiment, by tachometers, dead-fan signals. or other monitoring devices. Server 10 also preferably includes a plurality of temperature sensors that are controlled and continuously monitored by system software executing in system management unit 70. Two temperature sensors preferably are located within card cage 47, one of which reads incoming air temperature, i.e. ambient temperature, and one of which reads exiting air temperature. Two additional temperature sensors preferably also are provided, at the back of data server 10 according to a preferred embodiment, one of which is immediately below card cage 47 and the other of which is at the top of data server 10. System management unit 70 can be programmed to initiate a variety of actions based on the temperature sensor outputs, for example powering down the machine, sending warnings, etc. The ambient air sensor, in particular, may also serve as a fire sensing device, for example.

Figure 4A:
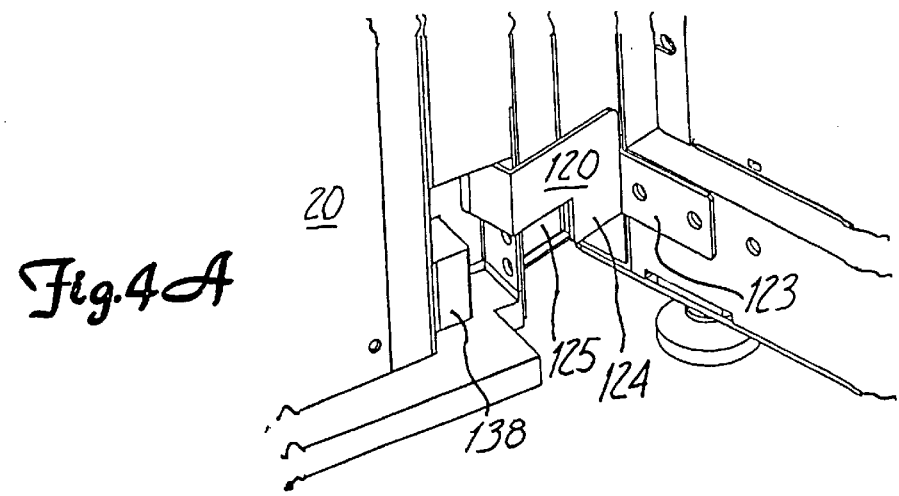
FIG. 4A is a perspective, close-up view of a front hinge structure according to one embodiment of the invention.

As discussed previously, preferred hinge arrangements are provided to allow the top and front doors of data servers 10 to be swung open without interfering with an immediately adjacent server or other object. Additionally, the hinge arrangements preferably are hidden from view when the top and front doors are in their closed positions, to reduce the likelihood of tampering. FIGS. 4A–4B illustrate upper and lower front door hinges 120, 130 and top door hinges 135, to achieve these purposes.

As shown in FIG. 4A, lower front door hinge 120 includes hinge plate 123, which preferably is bolted or otherwise attached to housing frame 15. Attached to hinge plate 123 and preferably integral as one-piece therewith is hinge plate 124, which includes a stepped, cutout portion 125. Front door 20 includes a corresponding protrusion block 138, which fits into cutout portion 125 underneath hinge plate 124 when front door 20 is in a closed position. The engagement between the top side of protrusion 138 and the lower side of hinge plate 124 at cutout 125 prevents vertical removal of front door 20 when it is in its closed position. As door 20 is moved toward its open position, protrusion 138 swings out from under hinge plate 124 to allow front door 20 to be lifted vertically off hinge 120 and completely removed from housing 15, if so desired. Further, as is clear from e.g. FIG. 4A, door 20 defines a recessed portion e.g. above protrusion 138. At least a portion of hinge 120, e.g. a distal portion of hinge plate 124 as viewed in FIG. 4A, becomes accommodated within the recess as the door moves to the closed position. Thus, it can be said that at least a portion of hinge 120 enters the recess as door 20 moves to its closed position, given the relative movement of door 20 and hinge 120 clear from FIG. 4A. Together, the door and the hinge itself comprise joint interlocking structure to prevent vertical removal of the door when in a closed position, while allowing vertical removal of the door when in an open position. Hinges 120, 130 thus enhance the overall security of data server 10, because front door 20 cannot be removed without being unlocked and opened, thereby triggering the various detection devices described previously. It should also be understood that, although hinges 120, 130, are only shown on front door 20, it is also contemplated that similar hinges could be provided for rear door 35.

As shown in FIG. 4B, uppermost front door hinge 130 includes hinge plates 133, 134, which preferably are integrally connected to form a one-piece structure. Hinge plate 134 supports front door 20 at its upper corner, preferably in a manner similar to that described for lower hinge 120.

Each top door hinge 135 includes hinge plates 140, 145, which are bolted or otherwise affixed to top door 30 and housing frame 15, respectively. Hinge plates 140, 145 are pivotally connected by hinge pin 150, which includes an upturned end portion 155 to provide a gripping surface for easy removal of pin 150 and therefore top door 30. Top door hinges 135 allow top door 30 to open without interfering with an adjacent data server or other object, while keeping hinges 135 hidden from view when top door 30 is closed.

Because data server 10 according to the invention is considerably more compact than its predecessors, it is considerably shorter and therefore more likely to receive beverage cups and other objects on the outside surface of top door 30. To minimize the potential for spilled liquid to enter data server 10 and damage valuable internal components, therefore, data server 10 preferably includes a guttering system supported by housing frame 15 just underneath top door 30. The guttering system preferably is in the form of a square-shaped ridge formed by four separate or integral metal pieces running around the top of frame 15. Left- and right-side gutter ridges 157 (FIG. 4B), 158 (FIG. 6) form two sides of the square-shaped ridge, and similar gutter ridges (not shown) extend along the forward and rear sides of frame 15 to complete the square. Additionally, the guttering system aids in electromagnetic interference (EMI) sealing of at least the lid area of data server 10.

According to a preferred embodiment, the data server components and internal wiring of data server 10 are arranged so that almost no wires are visible through the front, top or rear doors. All or substantially all of the power-associated components, such as power supplies 65 are located on the right-hand side of the machine, and the corresponding wiring runs behind at least one cover plate on the right-hand side of the machine. Similarly, all or substantially all of the I/O-associated component wiring is positioned to run behind at least one cover plate on the left-hand side of the machine. Additionally, approximately 80–90% of all the wiring is positioned in the very bottom portion of the machine, underneath bottom rack 60. By hiding all but approximately 2% of the machine wiring, a very neat and clean appearance is presented to the technician, unlike many prior art data servers. Additionally, the non-exposed wiring of data server 10 is less likely to suffer damage than the exposed and tangled wiring of many prior art servers.

Data server 10 according to the invention preferably is fully wired for its maximum configuration, i.e., for its maximum number of components, so that the wiring need not be changed or upgraded upon upgrading the machine.

Data server 10 according to the invention also preferably includes I/O connection arrangement 160 (FIG. 9A) at the back of server 10. Arrangement 160 includes patch panels 165 attached to the rear side of each disk drive rack 50, 55, and includes corresponding side patch panels 170 at the side of housing frame 15, extending substantially perpendicular to disk drive patch panels 165. Each patch panel 165, 170 preferably includes four connectors 166, for attachment to ribbon cable or other signal-relaying material.

Figure 9:
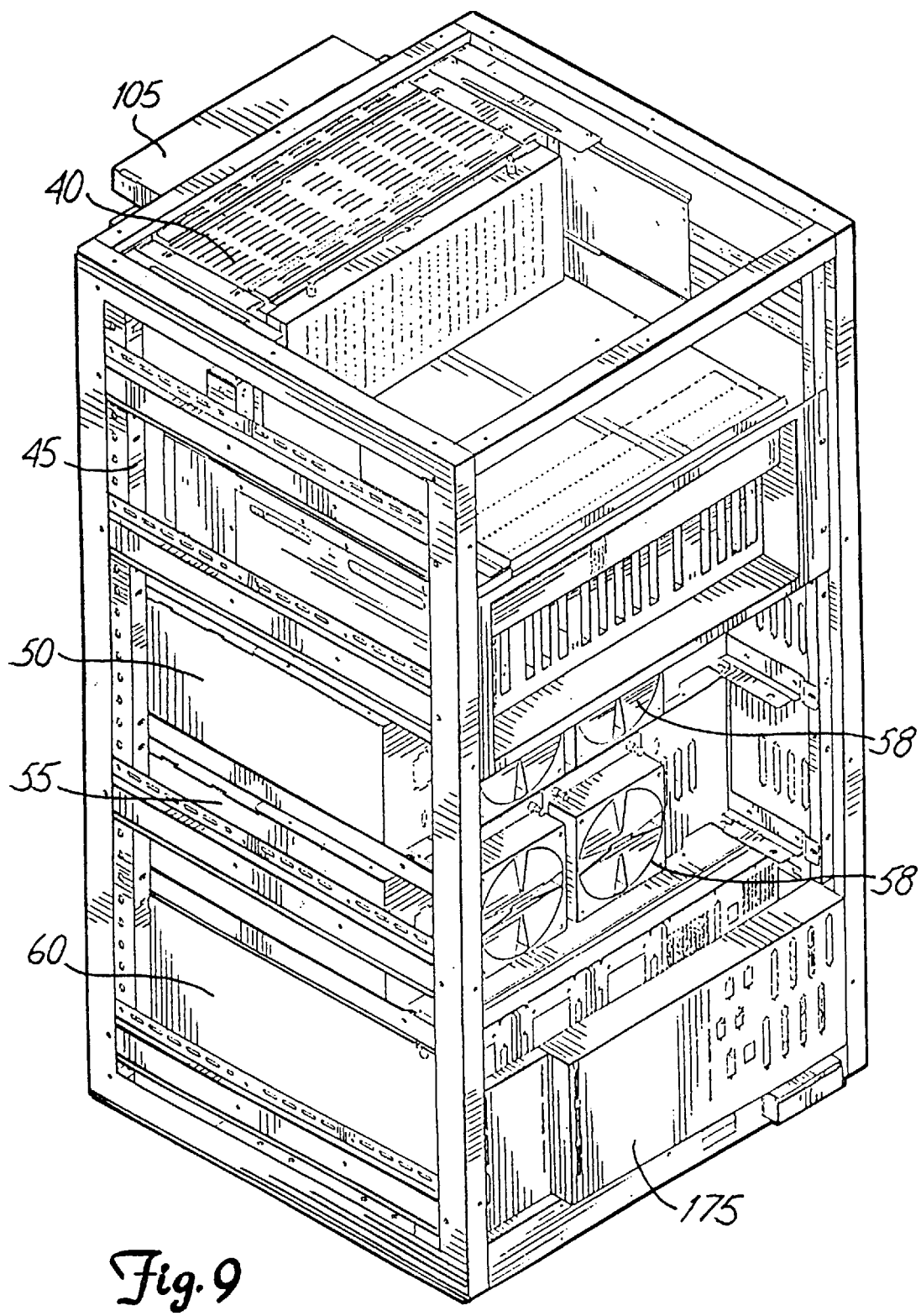
FIG. 9 is a rear perspective view of the FIG. 1 data server, also with external skins off.

As shown in FIG. 9, for example, data server 10 also includes a bulkhead 175, for connecting external wires to data server 10, for example. Bulkhead 175 preferably includes external I/O, with eight channels preferably available, serial ports, with four being preferable, and UPS support connections. Thus, bulkhead 175 enables external connection even with rear door 35 closed.

A number of I/O channels, for example eight, may be connected internally to card cage 47. Half of the channels, for example four, are coupled with bulkhead 175 for connection to external devices. The other half drop to internal patch panel 170. According to this example, two channels drop to the level of each disk drive rack 50, 55. There is also a corresponding adjacent drop to each of these on a patch panel that connects to bulkhead 175. Preferably by use of patch cabling, an I/O channel or channels can be connected to either or both disk drive racks 50, 55, and/or bulkhead 175, in various arrangements to achieve results desired by the operator of data server 10. At least 28 practical combinations and/or arrangements exist, according to a preferred embodiment.

Each disk drive rack 50, 55 is broken logically into halves, and/or has two I/O channels, so that up to five, half-height devices (e.g. 1.75 inches thick by 5.75 inches wide) can be connected on each channel. The two channels inside the rack can be "patched" together on the outside of the rack to put ten devices on the same channel. All power and fan signal connections preferably are made by one panel-mounted connector on the back of the rack. The fans are designed such that left and right fan signals can not be mixed or exchanged. As shown in FIG. 9, for example, data server 10 also includes a bulkhead 175, for connecting external wires to data server 10, for example. Bulkhead 175 preferably includes external I/O, with eight channels preferably available, serial ports, with four being preferable, and UPS support connections. Thus, bulkhead 175 enables external connection even with rear door 35 closed.

Figure 7:
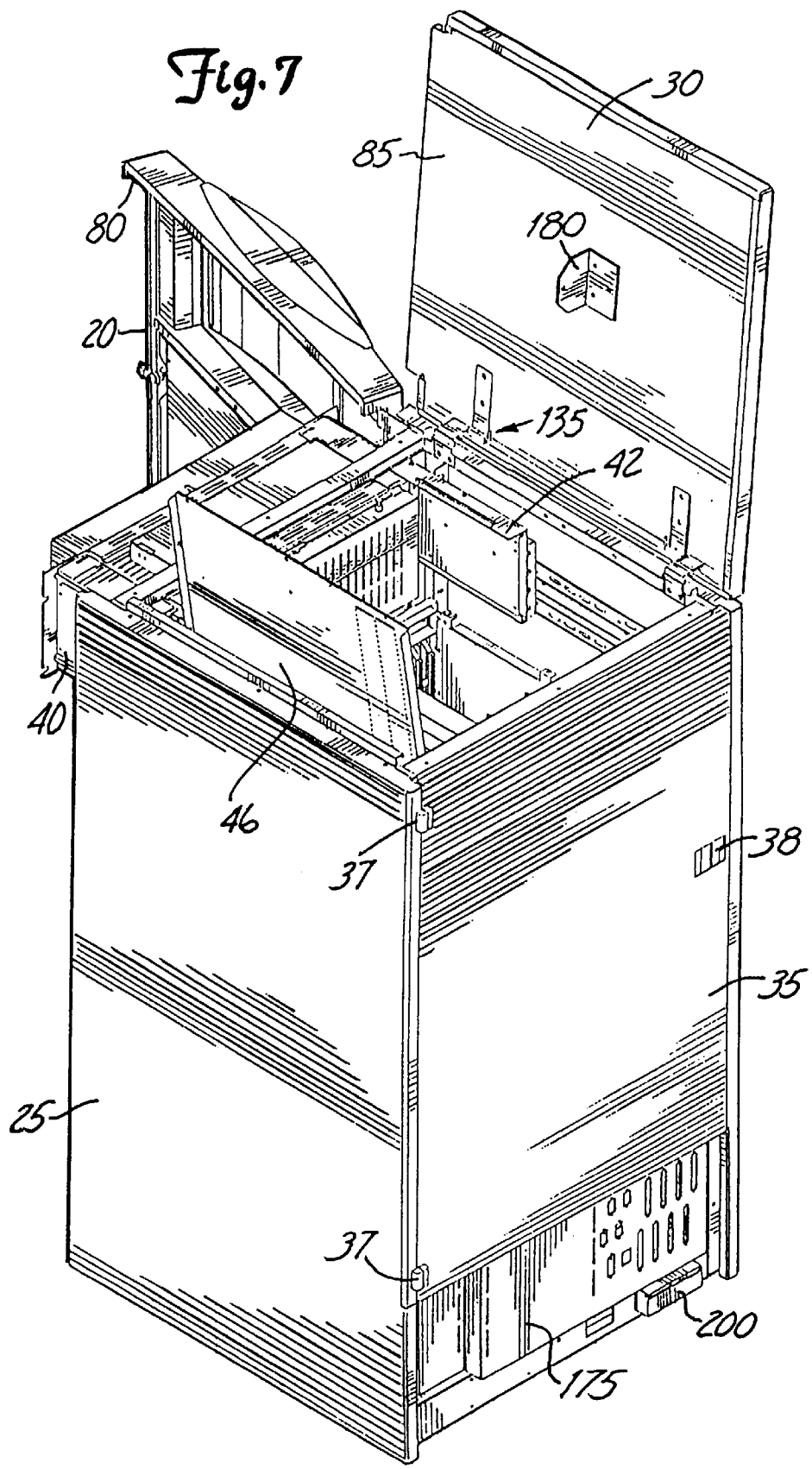
FIG. 7 is a rear perspective view of a data server as shown in FIG. 6.
Figure 8:
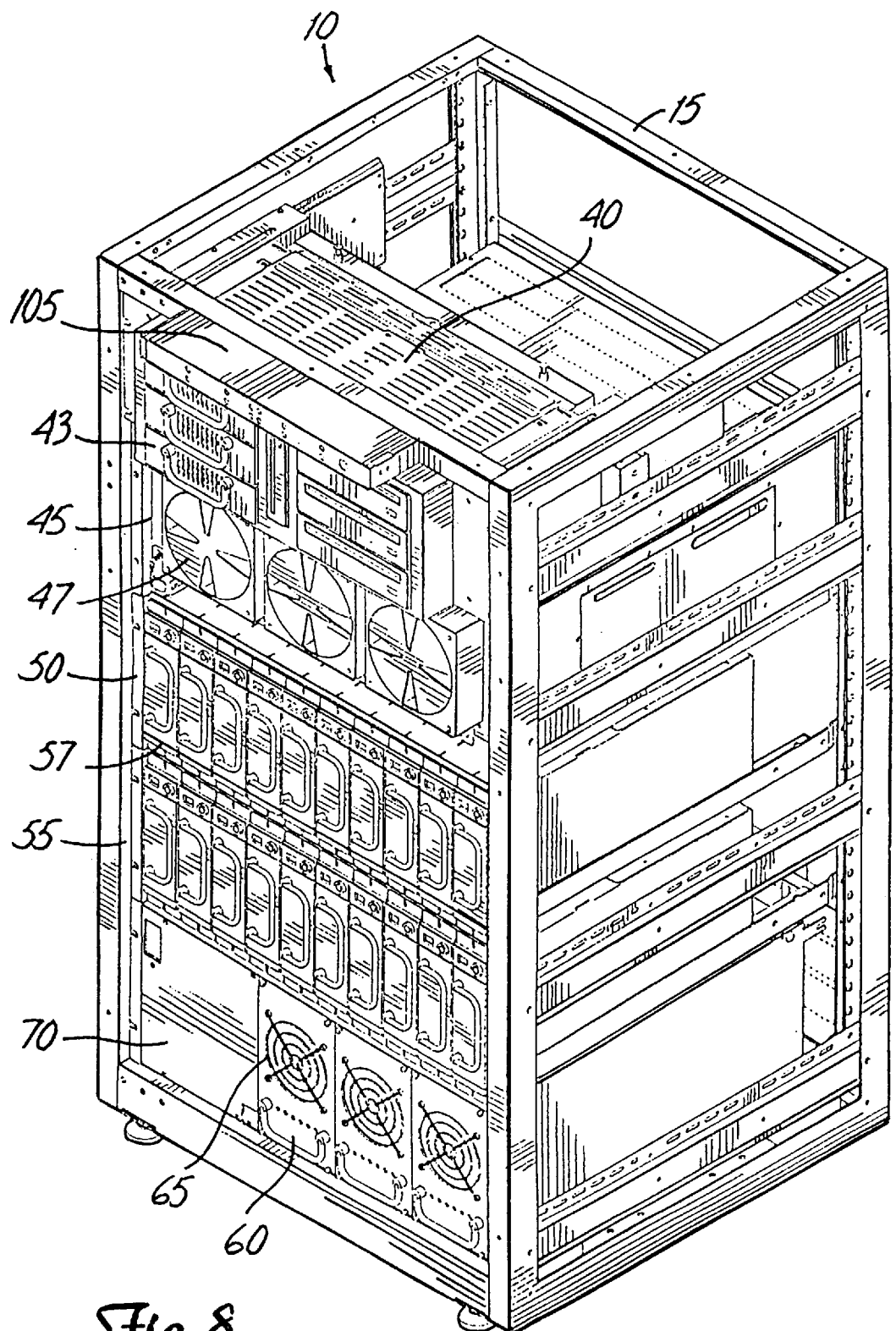
FIG. 8 is a perspective view of the FIG. 1 data server, with external skins off.

As shown in FIG. 7, data server 10 according to the invention preferably includes alternating current cord retention device 200, for the cord preferably provided with the machine. Device 200 preferably is fixed to frame 15 with a swivel half that prevents unintentional removal of the plug.

Data server 10 according to the invention also preferably includes shock-absorbing and/or movement-dampening devices (not shown), such as struts, for example, for at least front and top doors 20, 30. According to one embodiment, a pneumatic piston-cylinder assembly extends between bracket 180 on top door 30 and a lower bracket (not shown) attached to the left side of housing frame 15, for example directly below bracket 180 as viewed in FIG. 4, immediately adjacent gutter ridge 157. Similarly, a pneumatic piston-cylinder assembly preferably extends between a bracket on the inside of front door 20, centered on the door just below peripheral access door 75, horizontally over to a similar bracket at the lefthand side of frame 15. Such devices prevent damage due to slamming and/or overextending doors 20, 30, and hold the doors in open or partially open positions on their respective hinges.

Figure 10:
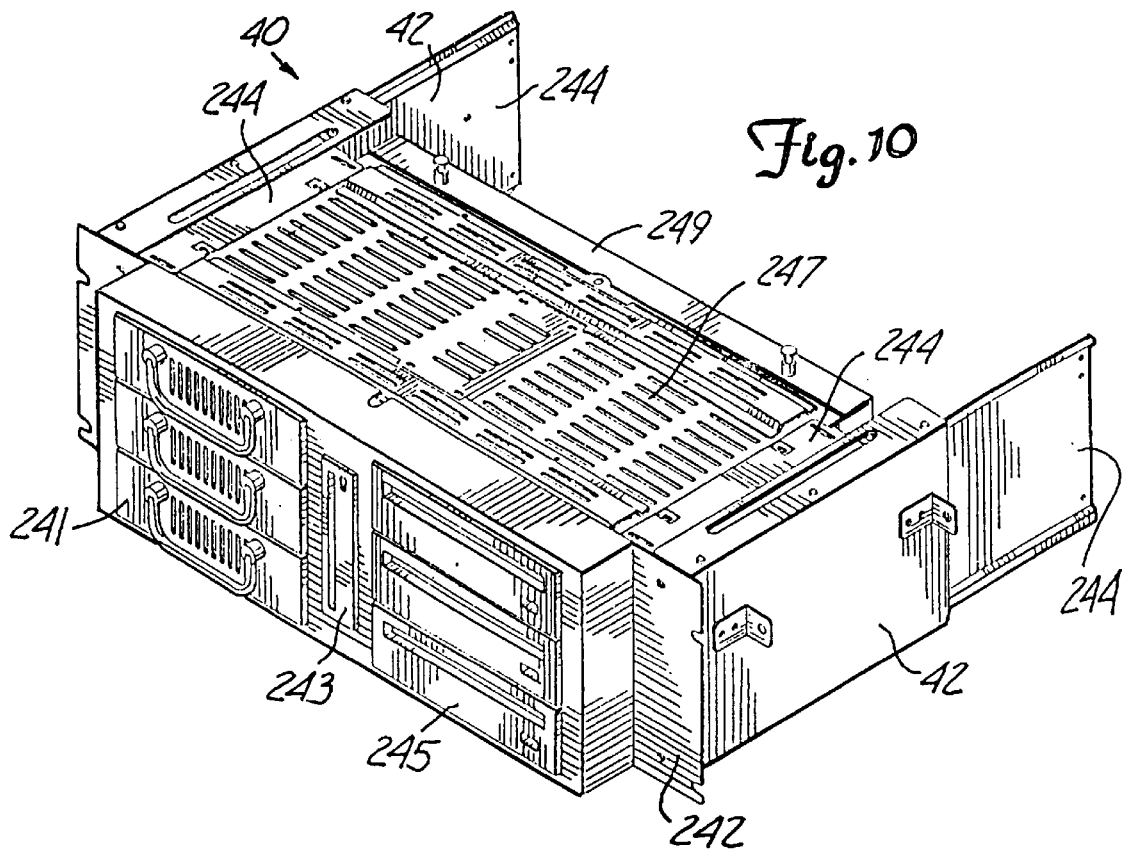
FIG. 10 is a perspective view of a peripheral rack according to one embodiment.

FIGS. 10–17 illustrate racks 40, 45, 50, 55 and 60 in greater detail. FIGS. 10–11 are assembled and exploded views, respectively, of peripheral rack 40. According to the illustrated embodiment, disk drives 241, floppy drive 243 and CD ROM drives 245 preferably are housed within peripherals cage 247, which includes front and rear plates 242, 249. The peripheral devices preferably slide into cage 247 from the front. Floppy drive 243 additionally can slide in from the back on rails, for example, for ease of installation and removal. Cage 247 and rear plate 249 include a plurality of vents 253, for promoting better air flow through peripheral rack 40. Cage 247 is supported within housing frame 15 by mounting plates 244, which linearly move along slides 42 in a manner previously described. Of course, cage 247 and front and/or rear plates 242, 249 can be configured to accommodate any desired number and types of peripheral storage devices 241, 243, 245.

Figure 12:
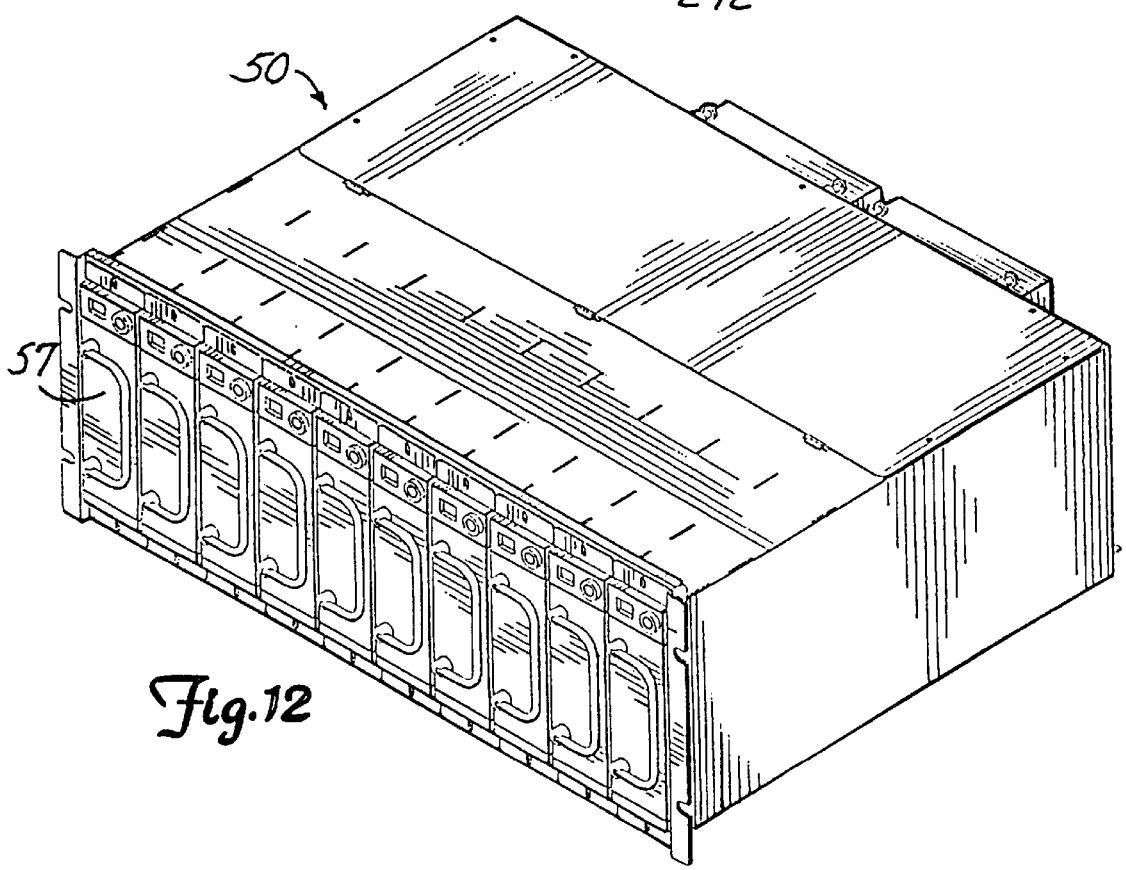
FIG. 12 is a perspective view of a disk drive rack according to an embodiment of the invention.

FIGS. 12–13 are assembled and exploded views, respectively, of disk drive rack 50, according to a preferred embodiment. Individual hard disk drives 57 are housed within drive cage 56, which includes an upper opening covered by access plate 59 and rear openings for accommodating disk drive fans 58.

Figure 14:
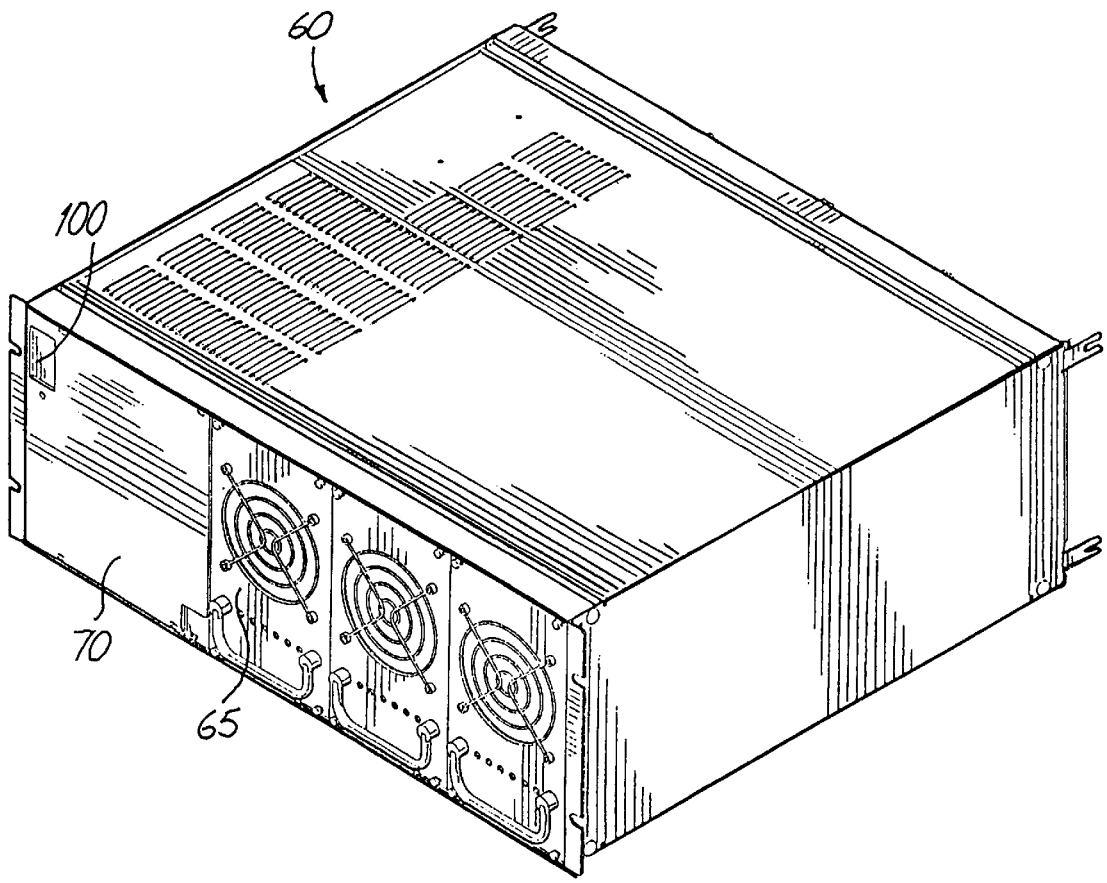
FIG. 14 is a perspective view of a power supply rack according to one embodiment.
Figure 15:
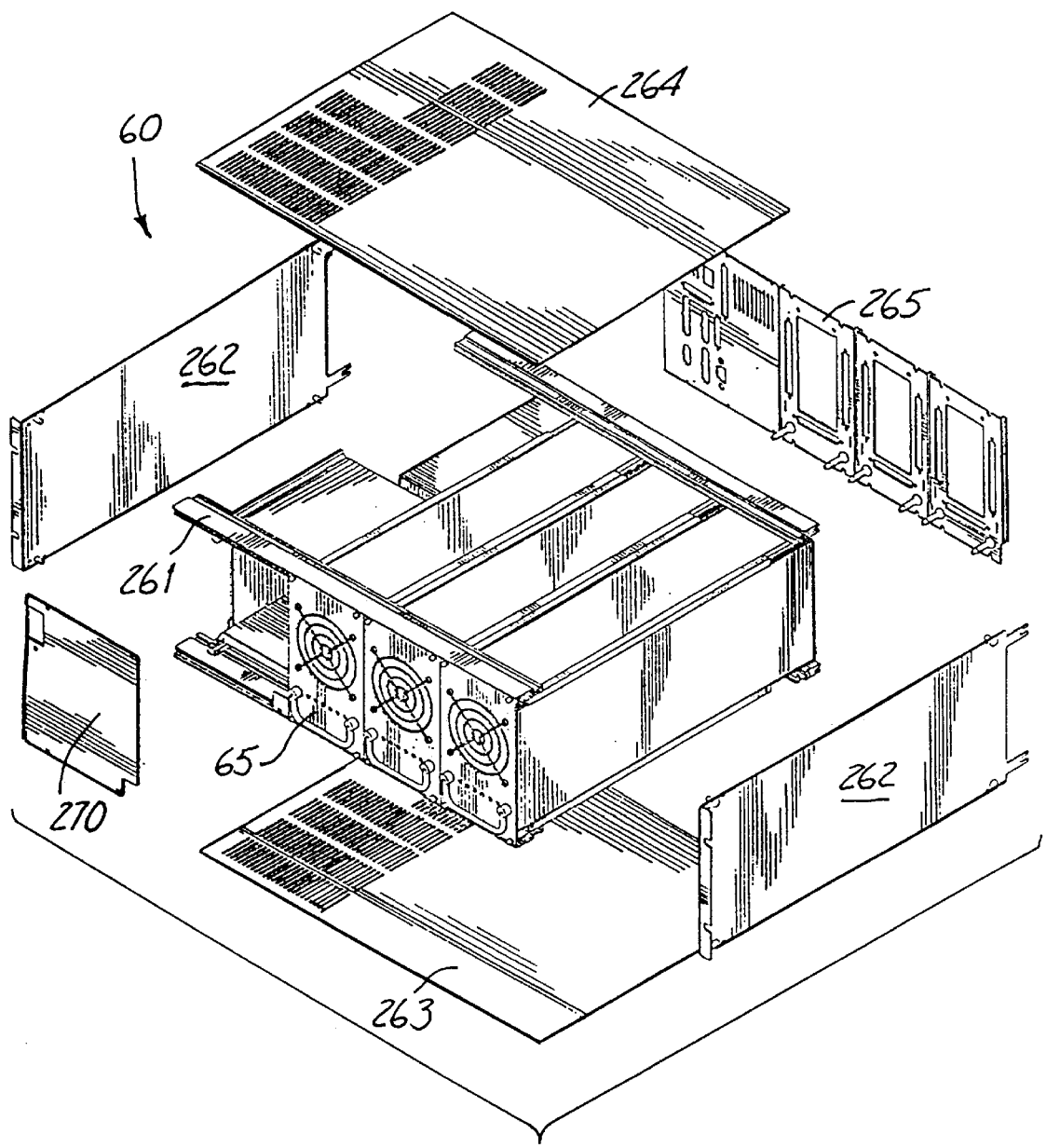
FIG. 15 is an exploded view of the FIG. 14 rack.

FIGS. 14 and 15 are assembled and exploded views, respectively, of power supply rack 60. Individual power supply units 65 and system management unit 70 are housed within cage 261, which is covered by side plates 262, top and bottom plates 263, 264, and rear plate 265, which preferably is a self-aligning hot-plug connector plate. Rack 60 also includes cover plate 270, for covering and protecting system management unit 70.

Figure 16:
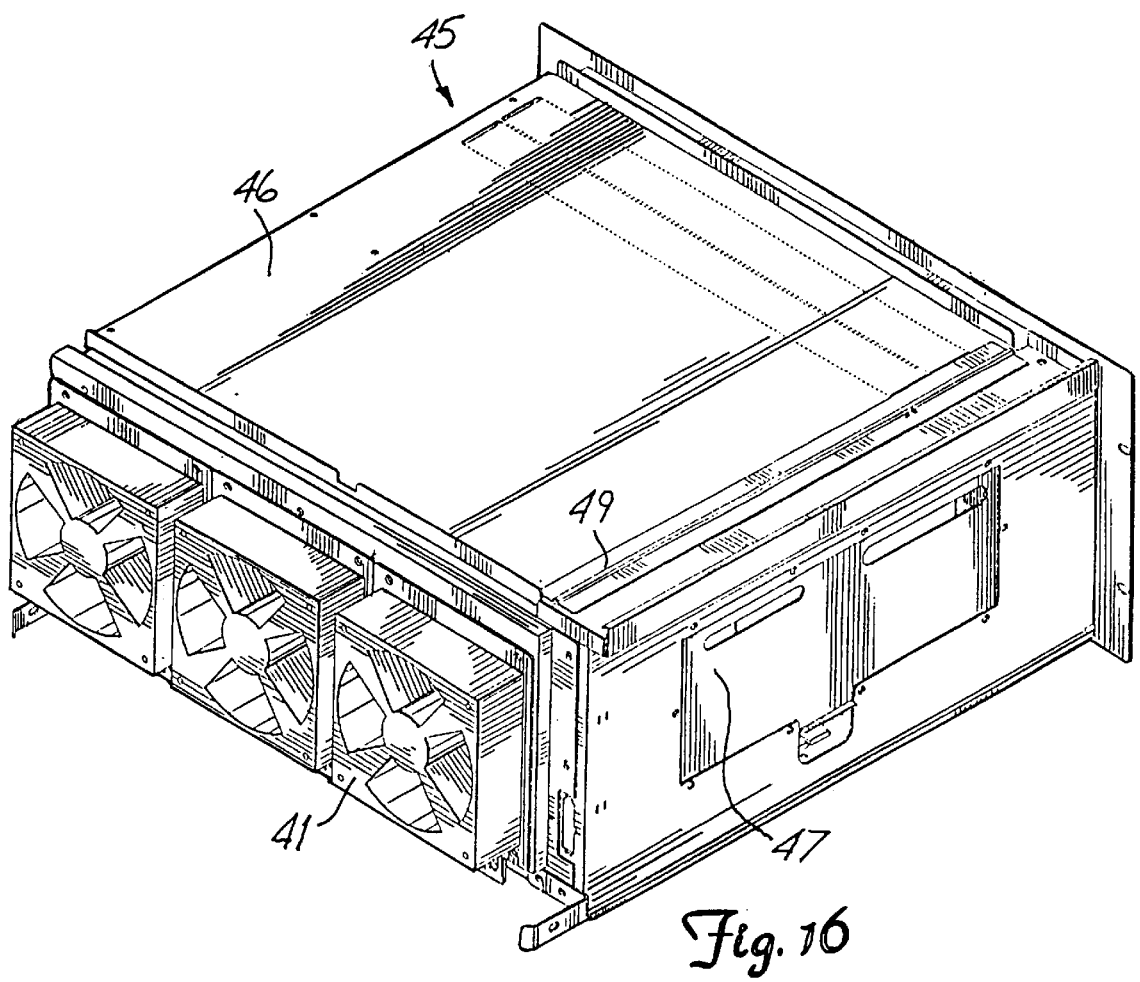
FIG. 16 is a perspective view of a card cage rack according to one embodiment.
Figure 17:
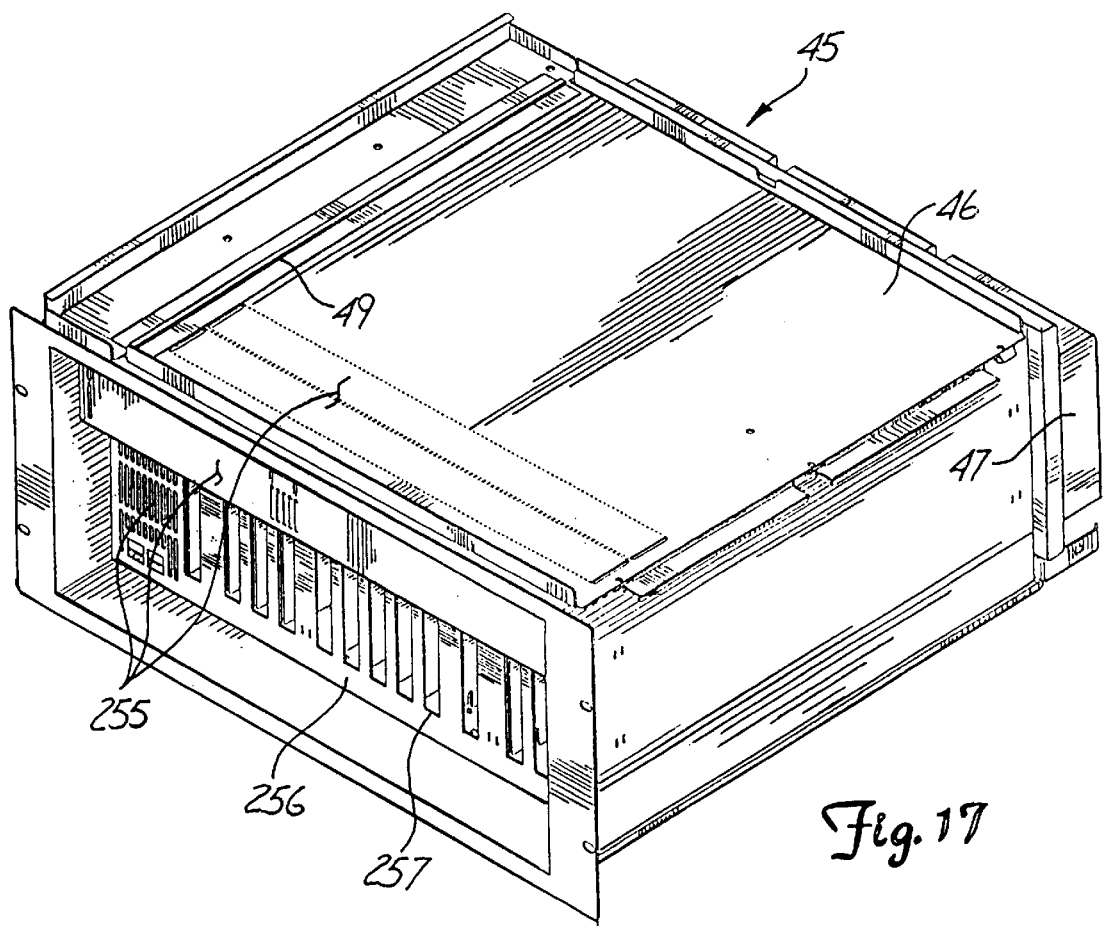
FIG. 17 is a rear perspective view of the FIG. 16 card cage rack.

FIGS. 16–17 are front and rear perspective views, respectively, of card cage rack 45. Card cage rack 45 includes lid 46 hinged at 49, as described previously. Card cage fans 41 push air through card cage 47 to exit at vents 255 in rear plate 256 and lid 46. Rear plate 256 also includes slots 257, for allowing connection to inserted components, for example daughter cards.

While the invention has been described with reference to specific embodiments, the description is illustrative and is not to be construed as limiting the scope of the invention. For example, a variety of materials can be used for the various parts of the invention, including the skins, frame and racks. Further, a wide variety of data server components are usable, not just those illustrated and described. Various other modifications and changes may occur to those skilled in the art without departing from the spirit and the scope of the invention as defined in the following claims.

What is claimed is:

1. A rack-mount data server, comprising:
   a housing comprising a front side and a top side;
   a plurality of data server components supported by the housing, the components comprising at least one peripheral storage device, a logic chassis for the data server, at least one disk drive on which the data server stores files, at least one power supply, and a system management unit;
   a plurality of racks coupled with the housing to accommodate the data server components;
   a front door positioned to cover the front side of the housing when the front door is in a closed position and to allow access to at least one of the data server components from the front side of the housing when the front door is in an open position; and
   a top door positioned to cover the top side of the housing when the top door is in a closed position and to allow access to at least one of the data server components from the top side of the housing when the top door is in an open position, the top door and the front door being interlockable with each other such that when the top door and the front door are in their closed positions, one of the top door and the front door locks the other of the top door and the front door in its closed position.

2. The data server of claim 1, further comprising at least one detection device, coupled with said one of the top door and the front door and with the system management unit, to signal the system management unit upon attempted access to data server components from outside the data server via said one door.

3. The data server of claim 2, wherein said one door includes a lock, the at least one detection device signaling the system management unit when the lock is unlocked.

4. The data server of claim 2, wherein the at least one detection device signals the system management unit when said one door is opened.

5. The data server of claim 2, wherein the at least one detection device comprises a microswitch.

6. The data server of claim 2, further comprising a system interrupt switch coupled with the system management unit, the system interrupt switch being selected from the group consisting of a system reset switch, a system abort switch, and a system off switch, the system interrupt switch being accessible only via said one door.

7. The data server of claim 1, further comprising:
   a peripheral rack for accommodating the at least one peripheral storage device;
   a peripheral access door disposed within the front door of the data server to allow access to the peripheral rack; and
   at least one detection device coupled with the peripheral access door and with the system management unit to signal the system management unit upon attempted access to the peripheral rack via the peripheral access door.

8. The data server of claim 1, wherein the logic chassis comprises an openable logic chassis cover disposed within the housing; the data server further comprising a detection device coupled with the logic chassis cover and with the system management unit to signal the system management unit upon attempted access to the logic chassis via the logic chassis cover.

9. The data server of claim 1, wherein the logic chassis comprises a plurality of printed circuit modules that are inaccessible from the back of the data server.

10. The data server of claim 1, wherein the front door of the data server comprises a lip and the top door of the data server comprises an abutting surface, the lip overlapping the abutting surface when the front door and top door are in their closed positions to prevent the top door from opening.

11. A side-by-side arrangement of multiple rack-mount data servers, comprising:
    a plurality of immediately adjacent data servers arranged side-by-side to form a row of data servers, each data server comprising:
       a housing comprising a front side and two sidewalls;
       a plurality of data server components supported within the housing, the components comprising a plurality of disk drives on which the data server stores files;
       a plurality of racks coupled with the housing to accommodate the data server components;
       a front door positioned to cover the front side of the housing when the front door is in a closed position and to allow access to data server components from the front side of the housing when the front door is in an open position, the front door extending across the housing from one sidewall to the other sidewall: the front door having an exterior and an interior, the front door defining a recess on the interior of the front door; and
       at least one internal hinge coupled with the front door and with the housing to allow the front door to open without interfering with an immediately adjacent data server, wherein the hinge is invisible from the exterior of the data server when the front door is in the closed position; further wherein at least a portion of the hinge enters a recess within the front door as the door moves to the closed position.

12. The data server arrangement of claim 11, wherein the plurality of disk drives of each data server comprise a plurality of plug-and-play disk drives.

13. A rack-mount data server, comprising:

a housing comprising a front side;

a plurality of data server components supported within the housing, the components comprising a plurality of data storage devices on which the data server stores data;

a plurality of racks coupled with the housing to accommodate the data server components;

a front door positioned to cover the front side of the housing when the front door is in a closed position and to allow access to data server components from the front side of the housing when the front door is in an open position; and at least one hinge coupled with the front door and with the housing to allow the front door to move to the open position;

wherein the front door and the at least one hinge comprise joint interlocking structure, the joint interlocking structure preventing vertical removal of the front door when the front door is in the closed position, the joint interlocking structure allowing vertical removal of the front door when the front door is in the open position.

14. The data server of claim 13, wherein the at least one hinge defines a substantially vertical pivot axis passing through an edge of the front door.

15. The data server of claim 13, wherein the housing of each data server further comprises a top side; further wherein each data server comprises:

a top door positioned to cover the top side of the housing when the top door is in a closed position and to allow access to at least one of the data server components from the top side of the housing when the top door is in an open position; and at least one hinge coupled with the top door and with the housing to cause the top door to move toward its open position without interfering with an immediately adjacent data server.

16. The data server of claim 13, wherein the joint interlocking structure comprises a stepped section of the at least one hinge and a protrusion of the front door, the protrusion being located within the stepped section of the at least one hinge to prevent vertical removal of the front door when the front door is in its closed position, the protrusion being removed from the stepped section of the at least one hinge to allow vertical removal of the front door when the front door is in its open position.

17. The data server of claim 13, further comprising a movement-dampening device connected between the housing and the front door to dampen movement of the front door between its open and closed positions.

18. The data server arrangement of claim 11, wherein the housing further comprises a top side; further wherein each data server comprises:

a top door positioned to cover the top side of the housing when the top door is in a closed position and to allow access to at least one of the data server components from the top side of the housing when the top door is in an open position; and at least one hinge coupled with the top door and with the housing to cause the top door to open without interfering with an immediately adjacent data server.

19. A rack-mount data server, comprising:

a housing comprising a front side;

a plurality of data server components supported within the housing, the components comprising a plurality of disk drives on which the data server stores files;

a plurality of racks coupled with the housing to accommodate the data server components;

a front door positioned to cover the front side of the housing when the front door is in a closed position and to allow access to the plurality of disk drives from the front side of the housing when the front door is in an open position; and at least one hinge coupled with the front door and with the housing to cause the front door to move to the open position without interfering with an immediately adjacent data server;

wherein the at least one hinge comprises a stepped section and the front door comprises a protrusion, the protrusion being located within the stepped section of the at least one hinge to prevent vertical removal of the front door when the front door is in its closed position, the protrusion being removed from the stepped section of the at least one hinge to allow vertical removal of the front door when the front door is in its open position.

* * * * *